(12) United States Patent
Sasaki et al.

(10) Patent No.: US 11,460,688 B2
(45) Date of Patent: *Oct. 4, 2022

(54) MIRROR DEVICE, SCANNING LASER DEVICE AND SCANNING LASER DISPLAY INCLUDING SAME MIRROR DEVICE, AND METHOD FOR MANUFACTURING MIRROR DEVICE

(71) Applicant: TOHOKU UNIVERSITY, Sendai (JP)

(72) Inventors: Takashi Sasaki, Sendai (JP); Kazuhiro Hane, Sendai (JP)

(73) Assignee: TOHOKU UNIVERSITY, Miyagi (JP)

( * ) Notice: Subject to any disclaimer, the term of this patent is extended or adjusted under 35 U.S.C. 154(b) by 278 days.

This patent is subject to a terminal disclaimer.

(21) Appl. No.: 16/549,546

(22) Filed: Aug. 23, 2019

(65) Prior Publication Data

US 2021/0055541 A1 Feb. 25, 2021

(51) Int. Cl.
*G02B 26/08* (2006.01)
*G02B 26/10* (2006.01)
*C23C 16/56* (2006.01)
*C23C 16/455* (2006.01)

(52) U.S. Cl.
CPC .... *G02B 26/0816* (2013.01); *C23C 16/45525* (2013.01); *C23C 16/56* (2013.01); *G02B 26/10* (2013.01)

(58) Field of Classification Search
CPC ................ G02B 26/0816; G02B 26/10; G02B 26/0833; G02B 26/101; G02B 26/105; G02B 27/0176; G02B 2027/0152; C23C 16/45525; C23C 16/56; C23C 16/0245
USPC ..................................... 359/199.1
See application file for complete search history.

(56) References Cited

U.S. PATENT DOCUMENTS

| | | | |
|---|---|---|---|
| 6,794,217 B2* | 9/2004 | Lee ..................... | G02B 26/0841 438/72 |
| 2021/0055505 A1* | 2/2021 | Sasaki ................. | G02B 26/105 |
| 2021/0055542 A1* | 2/2021 | Sasaki ................. | G02B 26/105 |

OTHER PUBLICATIONS

Chu Hoang Manh, "Vacuum operation of comb-drive micro display mirrors", J. Micromech. Microeng., 2009, pp. 1-8, vol. 19.

* cited by examiner

*Primary Examiner* — Euncha P Cherry
(74) *Attorney, Agent, or Firm* — Sughrue Mion, PLLC

(57) ABSTRACT

A mirror device includes a frame body, a shaft member provided inside the frame body and connected to the frame body, and a reflection member fixed to the shaft member and provided so as to be capable of swinging around an axis of the shaft member. The reflection member has a base portion provided along an axial direction of the shaft member and a reflection portion provided on the base portion. The base portion has a three-dimensional uneven structure including a bottom wall portion having a main surface provided along the axial direction of the shaft member and a plurality of side wall portions extending from the bottom wall portion opposite to the reflection portion.

18 Claims, 19 Drawing Sheets

MIRROR DEVICE, SCANNING LASER DEVICE AND SCANNING LASER DISPLAY INCLUDING SAME MIRROR DEVICE, AND METHOD FOR MANUFACTURING MIRROR DEVICE

BACKGROUND

The present disclosure relates to a mirror device, a scanning laser device and a scanning laser display including the mirror device, and a method for manufacturing a mirror device.

DESCRIPTION OF RELATED ART

In the related art, there are scanning laser devices including a mirror device such as a micro mirror. Micro mirrors are also referred to as scanners and are applied to mobile devices such as mobile displays due to their simple and small structures.

In recent years, for example, as wearable devices, head-mounted virtual reality (VR)/augmented reality (AR)/mixed reality (MR) displays have been attracting attention, and active research and development thereof has been underway. In order to produce more realistic VR/AR/MR, as an image projection system that is used for displays, small-sized and lightweight high-resolution scanning laser devices are required, and micro mirrors capable of realizing a small size, a light weight, and a high resolution are drawing attention.

A determinant of the resolution of scanning laser devices is the performance of micro mirrors, and the resolution varies with the operation frequencies, rotation angles (optical scan angles), and diameters of micro mirrors. A micro mirror has a structure in which a small-sized mirror is supported by a twisted spring, and, generally, the above-described three parameters of the operation frequency, the rotation angle, and the diameter have a trade-off relationship. For example, an increase in the operation frequency while maintaining the diameter of a mirror to be constant leads to an increase in the thickness of the mirror in order to suppress the dynamic deformation of the mirror. As a result, in order to suppress a decrease in the operation frequency attributed to the increase in the thickness of the mirror, the diameter of a torsion bar is increased, and, furthermore, the permissible break rotation angle of the torsion bar decreases. Therefore, it is difficult to improve all of the above-described parameters, and it is not easy to improve the resolution of scanning laser devices.

A requirement for an increase in the resolution of scanning laser devices is intensifying in association with an increase in the resolution of other display devices such as liquid crystal displays. For example, in the case of realizing a definition as high as that of HDTVs, a horizontal resolution of 1,920, a vertical resolution of 1,080, a horizontal scanning frequency of 36 kHz, and a product of an optical scanning angle and a diameter of 90 degrees·mm are required.

Hitherto, the present inventors have strived to increase the resolution using a variety of methods. For example, as a mirror device that is used for scanning laser displays, a micro mirror having a mirror plate supported by a frame portion through a torsion bar so as to be capable of swinging is disclosed (for example, Chu Hoang Manh, et al., Vacuum operation of Comb-drive micro display mirrors, J. Micromech Microeng. 19 (2009), 105018 (8 pp)). This micro mirror has a diameter of 420 μm, an operation frequency of 24.5 kHz, and an optical scanning angle of 5.14 degrees.

However, the configurations of the related art are not favorable enough to realize an additional increase in the resolution.

An object of the present disclosure is to provide a mirror device capable of realizing a higher resolution than in the related art, a scanning laser device and a scanning laser display including the mirror device, and a method for manufacturing a mirror device.

SUMMARY

According to a first aspect of the present disclosure, a mirror device includes a frame body, a shaft member provided inside the frame body and connected to the frame body, and a reflection member fixed to the shaft member and provided so as to swing around an axis of the shaft member, the reflection member has a base portion provided along an axial direction of the shaft member and a reflection portion provided on the base portion, and the base portion has a three-dimensional uneven structure including a bottom wall portion having a main surface provided along the axial direction of the shaft member and a plurality of side wall portions extending from the bottom wall portion opposite to the reflection portion.

A ratio of a height to a thickness of the side wall portion is preferably 20 or more and 100,000 or less.

The base portion is preferably formed of an ALD layer and/or an MLD layer.

The plurality of side wall portions may be formed of a plurality of fins disposed at intervals in the axial direction of the shaft member.

The base portion may include the bottom wall portion, a first side wall portion group formed of a plurality of pairs of first side wall portions extending in a first direction in a plan view of the base portion, and a first upper wall portion group formed of a plurality of first upper wall portions that couples the pair of first side wall portions.

In addition, the base portion may further include a pair of second side wall portions disposed so as to surround the first side wall portion group in a plan view of the base portion and a second upper wall portion that couples the pair of second side wall portions and is connected to the first upper wall portion group.

A through hole may be provided in at least one of the first upper wall portion and the second upper wall portion, the bottom wall portion, the pair of first side wall portions, and the first upper wall portion may define a first hollow portion, and the bottom wall portion, the pair of second side wall portions, and the second upper wall portion may define a second hollow portion.

In addition, the base portion may include the bottom wall portion, a first side wall portion group formed of a plurality of pairs of first side wall portions extending in a first direction in a plan view of the base portion, and a third side wall portion group formed of a plurality of pairs of third side wall portions that extends in a second direction intersecting the first direction and couples the pairs of first side wall portions.

The first side wall portion group and the third side wall portion group may be disposed in a grid shape in a plan view of the base portion.

The base portion may further include a third upper wall portion group formed of a plurality of third upper wall portions that is defined by two adjacent first side wall portions and two adjacent third side wall portions in a plan view of the base portion, one or a plurality of through holes may be provided in the third upper wall portion, and the bottom wall portion, the pair of first side wall portions, the pair of third side wall portions, and the third upper wall portion may define a third hollow portion.

In addition, the base portion may include the bottom wall portion, a first side wall portion group formed of a plurality of pairs of first side wall portions extending in a first direction in a plan view of the base portion, a third side wall portion group formed of a plurality of pairs of third side wall portions extending in a second direction intersecting the first direction, and a fourth side wall portion group formed of a plurality of pairs of fourth side wall portions extending in a third direction intersecting both the first direction and the second direction.

The first side wall portion group, the third side wall portion group, and the fourth side wall portion group may form a truss-shaped structure in a plan view of the base portion.

The base portion may further include a fourth upper wall portion that is defined by the first side wall portion group, the third side wall portion group, and the fourth side wall portion group in a plan view of the base portion, one or a plurality of through holes may be provided in the fourth upper wall portion, the bottom wall portion, the pair of first side wall portions, and a first portion of the fourth upper wall portion define a first portion of a fourth hollow portion, the bottom wall portion, the pair of third side wall portions, and a second portion of the fourth upper wall portion may define a second portion of the fourth hollow portion, and the bottom wall portion, the pair of fourth side wall portions, and a third portion of the fourth upper wall portion may define a third portion of the fourth hollow portion.

The mirror device may further include a pair of comb tooth portions provided in any of the frame body and the shaft member.

The base portion may be formed of a metal oxide, and the metal oxide may be $Al_2O_3$.

According to a second aspect of the present disclosure, a scanning laser device includes a laser light source, the mirror device, and a driving mechanism that is configured to drive the mirror device.

The scanning laser device may be a scanning laser display device.

According to a third aspect of the present disclosure, a method for manufacturing a mirror device has a step (A) of carrying out anisotropic deep reactive ion etching (RIE) on a device layer of an SOI wafer and forming an uneven portion extending in a direction perpendicular a main surface of the SOI wafer;

a step (B) of conformally depositing a first layer on the uneven portion by ALD and/or MLD;

a step (C) of forming a through hole or a through groove in the first layer formed on an upper surface of the uneven portion by anisotropic etching;

a step (D) of patterning the first layer formed on a handle layer of the SOI wafer by anisotropic etching;

a step (E) of removing the handle layer of the SOI wafer by anisotropic etching to expose an oxide layer of the SOI wafer;

a step (F) of removing the oxide layer by anisotropic RIE to expose a lower surface of the uneven portion;

a step (G) of conformally depositing a second layer on the first layer and the lower surface of the uneven portion by ALD and/or MLD;

a step (H) of removing the second layer formed in the through hole or the through groove by anisotropic etching to form the through hole or the through groove in the first layer again;

a step (I) of depositing a metal on the second layer from the handle layer side of the SOI wafer to form a reflection portion on the second layer; and a step (J) of removing the uneven portion of the device layer through the through hole or the through groove by isotropic RIE.

According to the present disclosure, it is possible to realize a higher resolution than in the related art.

DETAILED DESCRIPTION

Hereinafter, embodiments of the present disclosure will be described in detail with reference to drawings.

Figure 1:
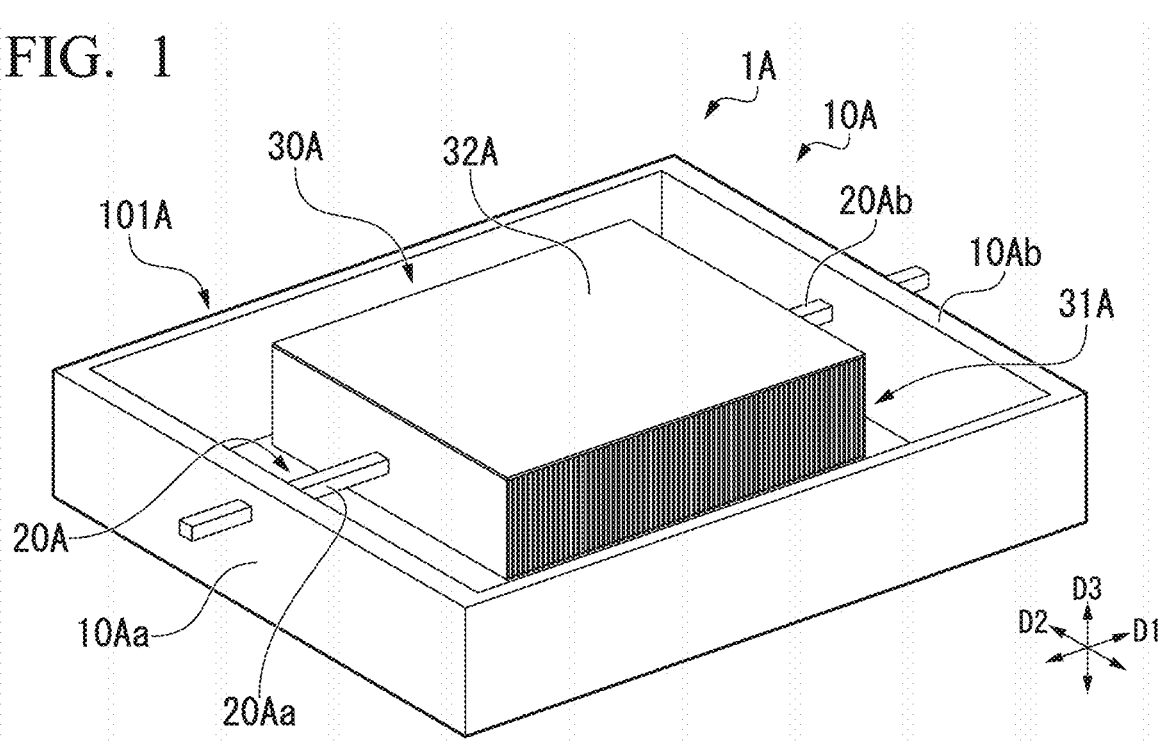
FIG. 1 is a perspective view schematically showing a configuration of a mirror device according to a first embodiment of the present disclosure.
Figure 2:
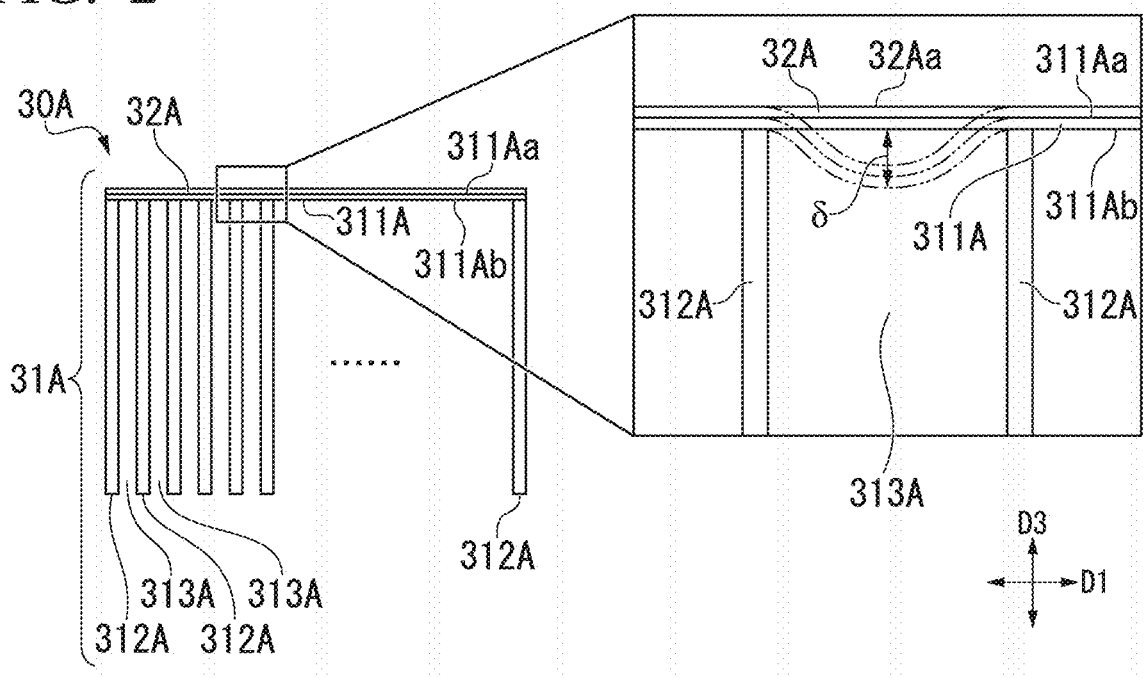
FIG. 2 is a partial enlarged side view of the mirror device of FIG. 1.

FIG. 1 is a perspective view schematically showing a configuration of a mirror device according to a first embodiment of the present disclosure, and FIG. 2 is a partial enlarged side view of the mirror device of FIG. 1. In some of the drawings to be used in the following description, a characteristic portion is shown in an enlarged manner for convenience in order to facilitate the understanding of the characteristic, and the shape, dimensional ratios, and the like of individual configurational elements are not limited to those shown in the drawings.

In the respective drawings, a D1 direction refers to a length direction of the mirror device. A D2 direction refers to a width direction of the mirror device. A D3 direction refers to a height direction of the mirror device.

As shown in FIG. 1, a mirror device 1A includes a frame body 10A, a shaft member 20A provided inside the frame body 10A and connected to the frame body 10A, and a reflection member 30A fixed to the shaft member 20A and provided so as to be capable of swinging around an axis of the shaft member 20A.

The frame body 10A in the present embodiment is disposed along an in-plane direction that is regulated by the D1 direction and the D2 direction and has a substantially rectangular shape in a plan view of the mirror device 1A. The frame body 10A is, for example, formed of a silicon (Si) layer, formed of a laminate of a silicon layer and an oxide layer, or formed of a germanium (Ge) layer. The silicon layer is formed of, for example, single-crystal silicon (Si), and the oxide layer is formed of, for example, silicon oxide ($SiO_2$ or the like).

The shaft member 20A has a first shaft portion 20Aa that couples, between a pair of facing frame portions 10Aa and 10Ab, the frame portion 10Aa and the reflection member 30A and a second shaft portion 20Ab that couples the frame portion 10Ab and the reflection member 30A. The shaft member 20A is integrally formed with, for example, a base portion 31A, described below, of the reflection member 30A. The shaft member 20A has, for example, a substantially rectangular shape in a cross-sectional view in the width direction (D2 direction).

The shaft member 20A is, for example, formed of a silicon (Si) layer, formed of a laminate of a silicon layer and an oxide layer, or formed of a germanium (Ge) layer. The silicon layer is formed of, for example, single-crystal silicon or polycrystal silicon, and the oxide layer is formed of, for example, silicon oxide ($SiO_2$ or the like).

As shown in FIG. 2, the reflection member 30A has a base portion 31A provided along the axial direction (D1 direction) of the shaft member 20A and a reflection portion 32A provided on the base portion. This base portion 31A has a three-dimensional uneven structure including an upper wall portion 311A having a main surface 311Aa provided along the axial direction (D1 direction) of the shaft member 20A and a plurality of side wall portions 312A, 312A, ... extending from the upper wall portion 311A opposite to the reflection portion 32A. In order to facilitate the understanding of the characteristic of the reflection member 30A, FIG. 1 and FIG. 2 show the upper wall portion 311 in a state of being located on the upper side; however, in a state in which the mirror device 1A is rotated 180 degrees around the shaft member 20A as a rotation center, the upper wall portion 311A forms a bottom wall portion.

The base portion 31A is a member that supports the reflection portion 32A and swings clockwise or counterclockwise due to stress generated by the torsion of the shaft member 20A. As described above, this base portion 31A is integrally formed with the shaft member 20A. The base portion 31A is substantially a cuboid and has, for example, a length (D1 direction) of 100 µm or more and 5,000 µm or less, a width (D2 direction) of 100 µm or more and 5,000 µm or less, and a height (D3 direction) of 10 µm or more and 2,000 µm or less. As an example, the base portion 31A is 2,000 µm in length, 2,000 µm in width, and 679 µm in height.

The base portion 31A is preferably formed of an ALD layer and/or an MLD layer. The ALD layer refers to a layer formed by atomic layer deposition, and the MLD layer refers to a layer formed by molecular layer deposition. The ALD/MLD layers can be specified as an object from the crystal state or the like and can be clearly differentiated from layers formed using other methods such as CVD or spin coating. When the base portion 31A is formed of the ALD layer and/or the MLD layer, it is possible to reliably realize a high aspect ratio of the side wall portion 312A.

The base portion 31A can be formed of any of a metal oxide and a metal nitride and is preferably formed of a metal oxide. The metal oxide is not particularly limited and is, for example, aluminum oxide ($Al_2O_3$). The metal nitride is, for example, silicon nitride (SiN or $Si_3N_4$).

The upper wall portion 311A has a substantially rectangular shape in a plan view of the base portion 31A and is formed across all of the base portion 31A in the plan view of the base portion 31A. The upper wall portion 311A has, for example, a thickness (D3 direction) of 20 nm or more and 500 nm or less. As an example, the thickness of the upper wall portion 311A is 50 nm. The reflection portion 32 is formed on one main surface 311Aa of the upper wall portion 311A, and the plurality of side wall portions 312A, 312A, ... is provided on the other main surface 311Ab.

The side wall portions 312A are disposed perpendicular to the upper wall portion 311A and have a substantially rectangular shape in a side view in the D1 direction (FIG. 1). The side wall portion 312A has, for example, a length (D2 direction) of 100 µm or more and 5,000 µm or less, a width (D3 direction) of 10 µm or more and 2,000 µm or less, and a thickness (D1 direction) of 20 nm or more and 500 nm or less. In particular, the ratio of the height to the thickness of the side wall portion 312A (the aspect ratio of a D3-direction dimension to a D1-direction dimension) is 20 or more and 100,000 or less, preferably 100 or more and 10,000 or less, more preferably 1,000 or more and 10,000 or less, particularly preferably 5,000 or more and 7,000 or less, and the side wall portion has a characteristic high aspect ratio. As an example, the side wall portion 312A is 2,000 µm in length (D2 direction), 679 µm in width (D3 direction), and 100 nm in thickness (D1 direction). At this time, the aspect ratio of the side wall portion 312A is 679/0.1=6,790.

In the present embodiment, the plurality of side wall portions 312A, 312A, ... is disposed side by side in the axial direction (D1 direction) of the shaft member 20A at intervals. A plurality of void portions 313A, 313A, ... is provided between the plurality of side wall portions 312A, 312A, .... The void portion 313A has a width (D1 direction) of, for example, 5 µm or more and 200 µm or less. As an example, in a case where the base portion 31A is formed of Al$_2$O$_3$, the width (D1 direction) of the void portion 313A is 57 μm.

In the present embodiment, the plurality of side wall portions 312A, 312A, . . . is formed of a plurality of fins disposed side by side in the axial direction (D1 direction) of the shaft member 20A. That is, the side wall portion 312A as the fin forms a protrusion portion in the three-dimensional uneven structure, and the void portion 313A between two side wall portions 312A and 312A forms a recess portion in the three-dimensional uneven structure.

The reflection portion 32A is formed on the main surface 311Aa of the upper wall portion 311A and formed across all of the main surface 311Aa. The reflection portion 32A has a thickness (D3 direction) of, for example, 50 nm or more and 500 nm. As an example, the thickness of the reflection portion 32A is 200 nm. The dynamic deformation amount in the thickness direction of the reflection portion 32A (the maximum bending amount δ in the D3 direction) is, for example, 70 nm or less.

The reflection portion 32A has a reflection surface 32Aa that reflects laser light radiated from the outside. The reflection surface 32Aa is a flat surface parallel to the main surface 311Aa of the upper wall portion 311A. This reflection portion 32A is formed of, for example, a metal. The metal is not particularly limited and is, for example, aluminum (Al).

The reflection portion 32A preferably has a large thickness (D3 direction) and a small diameter (distance from a rotation axis) so as to prevent dynamic deformation as much as possible. In particular, dynamic deformation quintically changes relative to a change in diameter, and thus a slight increase in diameter causes significant dynamic deformation. Therefore, the diameter of the reflection portion 32 is one of extremely important parameters for the mirror device 1A.

In addition, the rotation angle of the reflection member 30A is limited to a range in which stress generated by rotation does not cause the breakage of the shaft member 20. Under a constant torque and a constant operation resonant frequency, an optical scanning angle is inversely proportional to the moment of inertia of the reflection member 30A. Therefore, it is necessary to decrease the moment of inertia of the reflection member 30A in order to increase the optical scanning angle. The moment of inertia around the rotation axis is generally proportional to the mass and the square of the radius of rotation, and thus, when the width (D2 direction) of the reflection member 30A is decreased, the optical scanning angle can be increased. However, in order to realize a horizontal resolution of 1,920, which is as high as that of HDTVs, at an operation frequency of 40 kHz, it is necessary to increase the diameter (D3 direction) of the reflection portion 32 while suppressing an increase in the moment of inertia as much as possible.

Therefore, as an example of the conditions of the mirror device 1A, for example, an operation frequency of 40 kHz or more, an optical scanning angle of 60 degrees or more (a rotation angle of 15 degrees or more), a diameter (D2 direction) of the reflection portion 32A of 2 mm or more, and a dynamic deformation of 70 nm or less are assumed. In a case where the deformation amount in the thickness direction (D3 direction) of the reflection portion 32A is set to less than 70 nm (FIG. 2), under the above-described conditions showing the performance of the mirror device 1A, the width of the side wall portion 312 that supports the reflection portion 32A and the intervals between two adjacent side wall portions 312A and 312A are determined. For example, in a case where a material forming the base portion 31A is alumina (Al$_2$O$_3$) and the upper wall portion 311A is set to be thin enough to have no influence on the strength of the base portion 31A, it is possible to set the thickness (D3 direction) of the reflection portion 32A to 1 μm, the width (D3 direction) of the side wall portion 312A to 679 μm, the thickness (D2 direction) of the side wall portion 312A to 84 nm, and the width of the void portion 313A between two adjacent side wall portions 312A and 312A to 57 μm. In such a case, the reflection member 30A increases in diameter and decreases in weight, and an increase in the moment of inertia of the reflection member 30A is suppressed. Furthermore, the dynamic deformation amount in the thickness direction (D3 direction) of the reflection portion 32A is sufficiently suppressed, the flat surface state of the reflection surface 32Aa of the reflection portion 32A is maintained during the swinging of the reflection member 30A, and it is possible to suppress the interference of reflected light or the deformation of a spot pattern.

The material forming the base portion 31A may be a material other than alumina. Even in such a case, it is possible to determine the thickness of the reflection portion 32A, the width and thickness of the side wall portion 312A, and the width of the void portion 313A between two adjacent side wall portions 312A and 312A on the basis of the property values such as density of the material so that the above-described conditions of the mirror device 1A are satisfied.

The mirror device 1A of FIG. 1 can be manufactured using, for example, the following method. A silicon layer of a silicon wafer (SOI wafer or the like) is deep-etched, and an ALD layer and/or an MLD layer are deposited on uneven portions formed by the deep etching. Next, through grooves are formed on part of the upper surfaces of protrusion portions by etching, and then part of the silicon layer is etched as a sacrifice layer through the through grooves. The mirror device 1A can be obtained by repeating a series of the above-described steps. In addition, the mirror device 1A can also be manufactured using a manufacturing method described below.

As described above, according to the present embodiment, the base portion 31A has a three-dimensional uneven structure including the upper wall portion 311A (bottom wall portion) having a main surface provided along the axial direction (D1 direction) of the shaft member 20A and the plurality of side wall portions 312A, 312A, . . . extending from the upper wall portion 311A opposite to the reflection portion 32A, and thus it is possible to suppress the dynamic deformation of the reflection portion 32A while increasing the operation frequency, the optical scanning angle, and the diameter of the reflection member to be larger than in the related art, and it is possible to improve the resolution of scanning laser devices.

Figure 3:
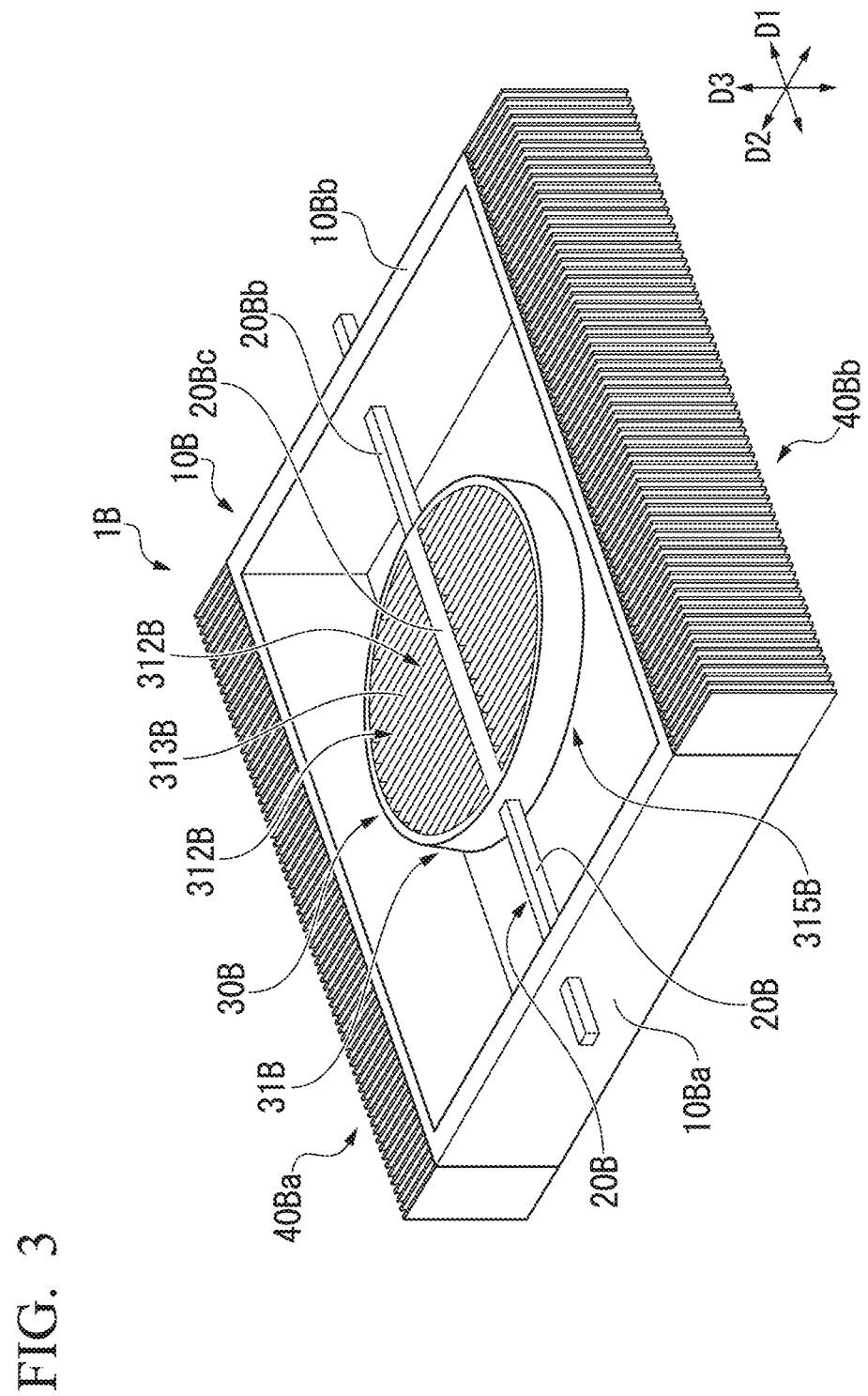
FIG. 3 is a perspective view schematically showing a configuration of a mirror device according to a second embodiment of the present disclosure.
Figure 4A:
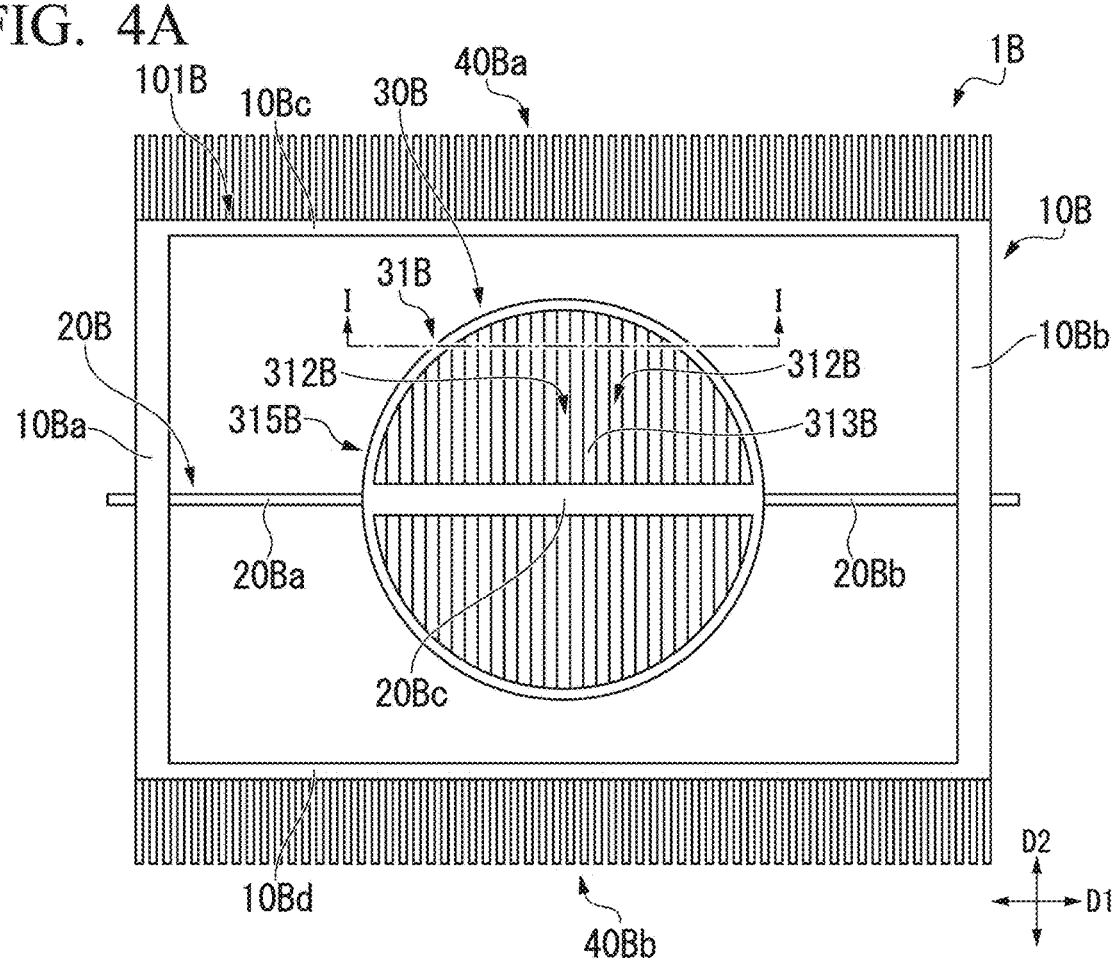
FIG. 4A is a plan view of the mirror device of FIG. 3.
Figure 4B:
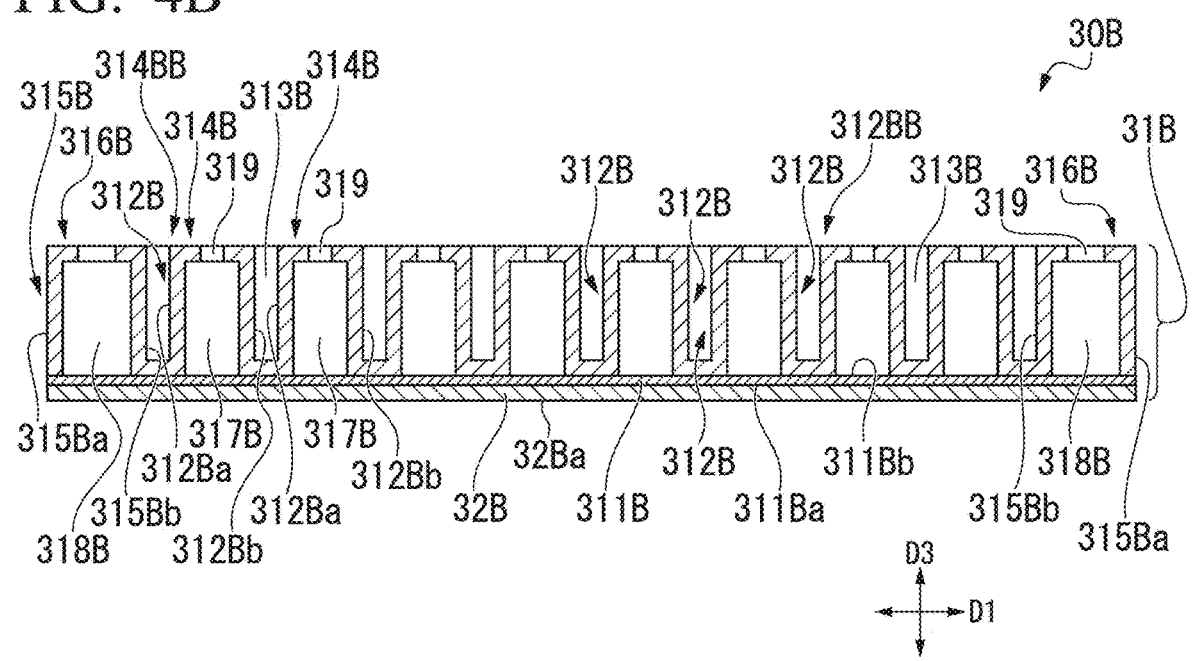
FIG. 4B is a cross-sectional view in a direction of a line I-I in FIG. 4A.
Figure 5:
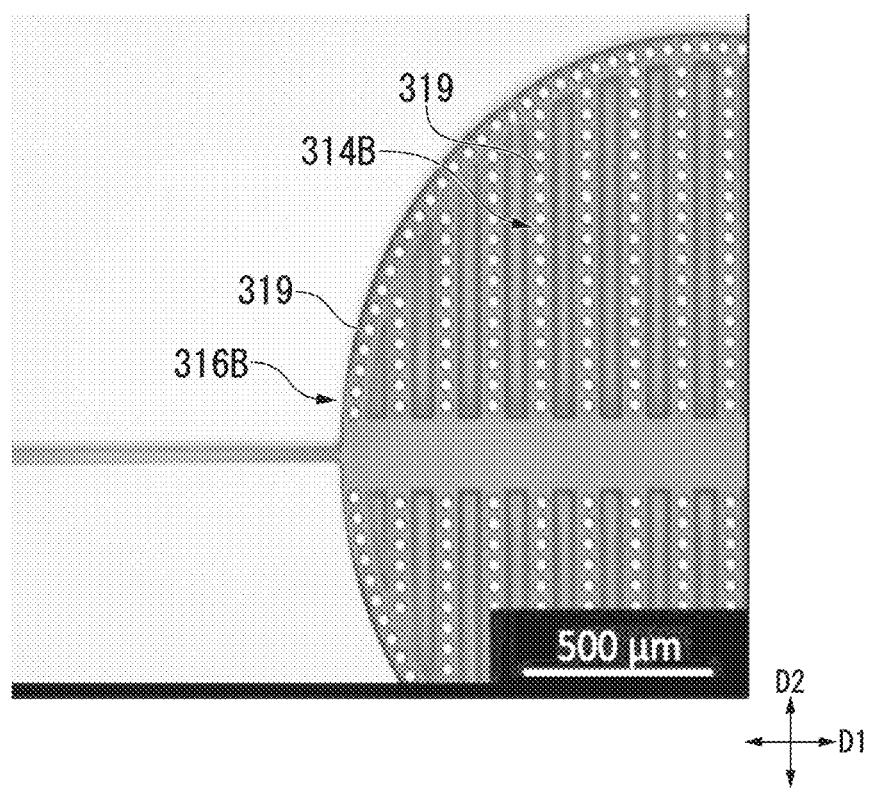
FIG. 5 is a partial enlarged plan view of the mirror device of FIG. 3.

FIG. 3 is a perspective view schematically showing a configuration of a mirror device according to a second embodiment of the present disclosure, FIG. 4A is a plan view of the mirror device of FIG. 3, and FIG. 4B is a cross-sectional view in a direction of a line I-I in FIG. 4A. FIG. 5 is a partial enlarged plan view of FIG. 4A.

As shown in FIG. 3 and FIG. 4A, a mirror device 1B includes a frame body 10B, a shaft member 20B provided inside the frame body 10B and connected to the frame body 10B, a reflection member 30B fixed to the shaft member 20B and provided so as to be capable of swinging around an axis of the shaft member 20B, and a pair of comb tooth portions 40Ba and 40Bb provided in the frame body 10B.

The frame body 10B in the present embodiment is disposed along the in-plane direction that is regulated by the D1 direction and the D2 direction and has a substantially rectangular shape in a plan view of the mirror device 1B. The frame body 10B has a length (D1 direction) of 200 μm or more and 10,000 μm or less and a width (D2 direction) of 100 μM or more and 5,000 μm or less. As an example, the frame body 10B is 4,400 μm in length and 2,600 μm in width. The frame body 10B is, for example, formed of a silicon (Si) layer, formed of a laminate of a silicon layer and an oxide layer, or formed of a germanium (Ge) layer. The silicon layer is formed of, for example, single-crystal silicon (Si), and the oxide layer is formed of, for example, silicon oxide ($SiO_2$ or the like).

The shaft member 20B has a first shaft portion 20Ba that couples, between a pair of facing frame portions 10Ba and 10Bb, the frame portion 10Ba and the reflection member 30B, a second shaft portion 20Bb that couples the frame portion 10Bb and the reflection member 30B, and a third shaft portion 20Bc that passes through the center of the reflection member 30B and is connected to the first shaft portion 20Ba and the second shaft portion 20Bb. The shaft member 20B has a substantially square shape in a cross section in the width direction (D2 direction). The shaft member 20B has, for example, a length (D1 direction) of 200 μm or more and 12,000 μm or less and a width (D2 direction) of 5 μm or more and 300 μm or less. As an example, the shaft member 20B is 4,400 μm in length and 24 μm in width.

The shaft member 20B is integrally formed with a base portion 31B, described below, of the reflection member 30B. However, the configuration is not limited thereto, and the shaft member 20B may further have a rod-shaped member disposed in the shaft center of the shaft member 20B as a skeleton. In such a case, the stiffness of the shaft member 20B against rotation increases, and a larger optical scanning angle can be stably obtained. In addition, the width of the third shaft portion 20Bc is larger than the widths of the first shaft portion 20Ba and the second shaft portion 20Bb, but these widths may be the same as each other.

The shaft member 20B is, for example, formed of a silicon (Si) layer, formed of a laminate of a silicon layer and an oxide layer, or formed of a germanium (Ge) layer. The silicon layer is formed of, for example, single-crystal silicon or polycrystal silicon, and the oxide layer is formed of, for example, silicon oxide ($SiO_2$ or the like).

As shown in FIG. 4B, the reflection member 30B has a base portion 31B provided along the axial direction (D1 direction) of the shaft member 20B and a reflection portion 32B provided on the base portion. This base portion 31B has a three-dimensional uneven structure including a bottom wall portion 311B having a main surface 311Ba provided along the axial direction (D1 direction) of the shaft member 20B and a plurality of side wall portions 312B, 315B, ... extending from the bottom wall portion 311B opposite to the reflection portion 32B.

The plurality of side wall portions 312B, 312B, ... is disposed side by side in the axial direction (D1 direction) of the shaft member 20B at intervals. A plurality of void portions 313B, 313B, ... is provided between the plurality of side wall portions 312B, 312B, ....

Specifically, the base portion 31B in the present embodiment includes the bottom wall portion 311B, a first side wall portion group 312BB formed of a plurality of pairs of first side wall portions 312Ba and 312Bb extending in a first direction (D2 direction) in a plan view of the base portion 31B, and a first upper wall portion group 314BB formed of a plurality of first upper wall portions 314B that couples the pair of first side wall portions 312Ba and 312Bb. In addition, in the present embodiment, the base portion 31B further includes a pair of second side wall portions 315Ba and 315Bb disposed so as to surround the first side wall portion group 312BB in the plan view of the base portion 31B and a second upper wall portion 316B that couples the pair of second side wall portions 315Ba and 315Bb and is connected to the first upper wall portion group 314BB.

That is, in the present embodiment, the bottom wall portion 311B that defines a first hollow portion 317B, the pair of first side wall portions 312Ba and 312Bb, and a first upper wall portion 314B form a protrusion portion in the three-dimensional uneven structure. In addition, the bottom wall portion 311B that defines a second hollow portion 318B, the pair of second side wall portions 315Ba and 315Bb, and the second upper wall portion 316B form another protrusion portion in the three-dimensional uneven structure. In addition, the void portion 313B between two adjacent first side wall portions 312Ba and 312Bb form a recess portion in the three-dimensional uneven structure.

The base portion 31B is a member that supports the reflection portion 32B and swings clockwise or counterclockwise due to stress generated by the torsion of the shaft member 20B. As described above, this base portion 31B is integrally formed with the shaft member 20B. The base portion 31B has a substantial disc shape and has a diameter of 100 μm or more and 5,000 μm or less and a height (D3 direction) of 10 μm or more and 2,000 μm or less. As an example, the base portion 31B is 2,000 μm in length and 90 μm in height.

The base portion 31B is preferably formed of an ALD layer and/or an MLD layer. In such a case, it is possible to reliably realize a high aspect ratio of the side wall portion 312B.

The base portion 31B in the present embodiment is formed by a dry process of ALD and/or MLD, but the method is not limited thereto, and the base portion may be formed by other dry processes such as LP-CVD with a condition of the obtainment of the above-described high aspect ratio.

The base portion 31B can be formed of any of a metal oxide and/or a metal nitride and is preferably formed of a metal oxide. The metal oxide is not particularly limited and is, for example, aluminum oxide ($Al_2O_3$). The metal nitride is, for example, silicon (SiN or $Si_3N_4$).

The bottom wall portion 311B has a substantially circular shape in the plan view of the base portion 31B and is formed across all of the base portion 31B in the plan view of the base portion 31B. The bottom wall portion 311B has a thickness (D3 direction) of 20 nm or more and 500 nm or less. As an example, the thickness of the bottom wall portion 311B is 100 nm. The reflection portion 32B is formed on one main surface 311Ba of the bottom wall portion 311B, and the plurality of side wall portions 312B, 312B, ... is provided on the other main surface 311Bb.

The pairs of first side wall portions 312Ba and 312Bb are disposed perpendicular to the bottom wall portion 311B and have a substantially rectangular shape in the side view in the D1 direction. Each of the pairs of first side wall portion 312Ba and 312Bb has, for example, a length (D2 direction) of 100 μm or more and 5,000 μm or less, a width (D3 direction) of 10 μm or more and 2,000 μm or less, and a thickness (D1 direction) of 20 nm or more and 500 nm or less. The ratio of the height to the thickness of each of the pairs of first side wall portion 312Ba and 312Bb (the aspect ratio of the D3-direction dimension to the D1-direction dimension) is 20 or more and 100,000 or less, preferably 100 or more and 10,000 or less, more preferably 500 or more and 5,000 or less, particularly preferably 800 or more and 1,200 or less, and each of the pairs of side wall portions has a characteristic high aspect ratio. As an example, each of the pairs of first side wall portion 312Ba and 312Bb is 2,000 μm in length, 90 μm in width, and 100 nm in thickness. In this case, the aspect ratio of each of the pairs of first side wall portions 312Ba and 312Bb is 900.

The first upper wall portion 314B is long in a plan view in the D3 direction (FIG. 4B). The first upper wall portion 314B has, for example, a width (D1 direction) of 30 μm or more and 70 μm or less and a thickness (D3 direction) of 20 nm or more and 500 nm or less. As an example, the first upper wall portion 314B is 65 μm in width and 100 nm in thickness. In a case where the width of the first upper wall portion 314B is sufficiently wide, it is possible to reliably form a through hole described below in the first upper wall portion 314B.

The pair of second side wall portions 315Ba and 315Bb has a substantially annular shape in the plan view in the D3 direction. The pair of second side wall portion 315Ba and 315Bb has, for example, a width (D3 direction) of 10 μm or more and 2,000 μm or less and a thickness (D1 direction) of 20 nm or more and 500 nm or less. The pair of second side wall portions 315Ba and 315Bb has an aspect ratio as high as that of the pair of first side wall portions 312Ba and 312Bb. As an example, the pair of second side wall portion 315Ba and 315Bb is 90 μm in width, 100 nm in thickness, and 900 in aspect ratio. The annular pair of second side wall portions 315Ba and 315Bb being coupled with the plurality of pairs of first side wall portions 312Ba and 312Bb improves the stiffness of the base portion 31B.

The second upper wall portion 316B has a substantially annular shape in the plan view in the D3 direction (FIG. 4B). The second upper wall portion 316B has, for example, a width of 30 μm or more and 70 μm or less and a thickness (D3 direction) of 20 nm or more and 500 nm or less. As an example, the second upper wall portion 316B is 65 μm in width and 100 nm in thickness. In a case where the width of the second upper wall portion 316B is sufficiently wide, it is possible to reliably form a through hole described below in the second upper wall portion 316B.

In each of the first upper wall portion 316Ba and the second upper wall portion 316B, as shown in FIG. 5, a plurality of through holes 319, 319, . . . is provided. In the present embodiment, the plurality of through holes 319 and 319 is formed along a longitudinal direction (D2 direction) of the first upper wall portion 314B at equal intervals. In addition, the plurality of through holes 319, 319, . . . is formed along a circumferential direction of the second upper wall portion 316B at equal intervals. The through hole 319 has, for example, an inner diameter of 10 μm or more and 50 μm or less. As an example, the inner diameter of the through hole 319 is 30 μm. One or a plurality of the through holes 319 may be provided in at least one of the first upper wall portion 316Ba and the second upper wall portion 316B.

In the present embodiment, the bottom wall portion 311B, the pair of first side wall portions 312Ba, and 312Bb, and the first upper wall portion 314B define the first hollow portion 317B. In addition, the bottom wall portion 311B, the pair of second side wall portions 315Ba and 315Bb, and the second upper wall portion 316B define the second hollow portion 318B. The formation of the through holes 319 having a sufficient opening area in the first upper wall portion 314B enables the reliable formation of the first hollow portion 317B by isotropic etching described below. In addition, the formation of the through holes 319 having a sufficient opening area in the second upper wall portion 316B enables the reliable formation of the second hollow portion 318B by the isotropic etching described below.

The reflection portion 32B is formed on the main surface 311Ba of the bottom wall portion 311B and formed across all of the main surface 311Ba. The reflection portion 32B has a thickness (D3 direction) of, for example, 0.05 μm or more and 1 μm. As an example, the thickness of the reflection portion 32B is 0.2 μm. The dynamic deformation amount in the thickness direction of the reflection portion 32B (the maximum bending amount in the D3 direction) is preferably as small as possible and is, for example, 70 nm or less.

The reflection portion 32B has a reflection surface 32Ba that reflects laser light radiated from the outside. The reflection surface 32Ba is a flat surface parallel to the main surface 311Ba of the bottom wall portion 311B. This reflection portion 32B is formed of, for example, a metal. The metal is not particularly limited and is, for example, substantially aluminum (Al).

The pair of comb tooth portions 40Ba and 40Bb is provided in another pair of facing frame portions 10Bc and 10Bd and extends in a direction (D2 direction) perpendicular to the axial direction (D1 direction) in the plan view of the mirror device 1B. One comb finger forming the pair of comb tooth portions 40Ba and 40Bb has, for example, a length (D2 direction) of 100 μm or more and 500 μm or less and a width (D1 direction) of 10 μm or more and 40 μm or less. As an example, the comb finger is 300 μm in length and 25 μm in width. Another pair of comb tooth portions is provided near (for example, below) the pair of comb tooth portions 40Ba and 40Bb, and the frame body 10B swings by, for example, an electromagnetic driving method. Due to this swing of the frame body 10B, the reflection member 30 oscillates in antiphase relative to the frame body 10B.

When the above-described conditions described in the first embodiment are taken into account, in a case where a material forming the base portion 31B is alumina ($Al_2O_3$), it is possible to set the thickness (D3 direction) of the reflection portion 32B to 0.2 μm, the widths (D3 direction) of the pair of first side wall portions 312Ba and 312Bb and the pair of second side wall portions 315Ba and 315Bb to 90 μm, the thicknesses (D1 direction) of the pair of first side wall portions 312Ba and 312Bb and the pair of second side wall portions 315Ba and 315Bb to 100 nm, and the width of the void portion 313B between two adjacent first side wall portions 312Ba and 312Bb to 40 μm. The reflection member 30B increases in diameter and decreases in weight, an increase in the moment of inertia of the reflection member 30B is suppressed, furthermore, the dynamic deformation in the thickness direction (D3 direction) of the reflection portion 32B is sufficiently suppressed. Therefore, the flat surface state of the reflection surface 32Ba of the reflection portion 32B is maintained during the swinging of the reflection member 30B, and it is possible to suppress the interference of reflected light or the deformation of a spot pattern.

The material forming the base portion 31B may be a material other than alumina. Even in such a case, it is possible to determine the thickness of the reflection portion 32B, the widths and thicknesses of the pair of first side wall portions 312Ba and 312Bb and the pair of second side wall portions 315Ba and 315Bb, and the width of the void portion 313B between two adjacent first side wall portions 312Ba and 312Bb on the basis of the property values such as density of the material so that the above-described conditions of the mirror device 1B are satisfied.

Next, an example of a method for manufacturing the mirror device 1B of FIG. 3 will be described with reference to FIG. 6A to FIG. 10C. The method for manufacturing the mirror device 1B according to the present embodiment has the following step (A) to step (J).

Figure 6A:
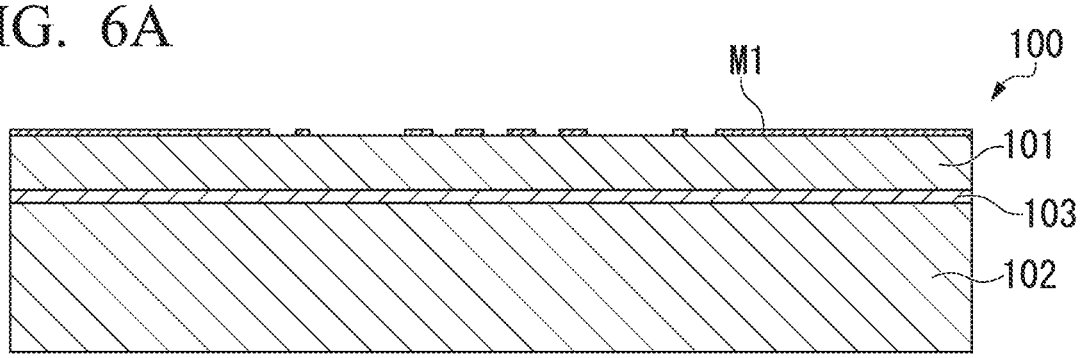
FIG. 6A to FIG. 6C are step views showing an example of a method for manufacturing the mirror device of FIG. 3.
Figure 6B:
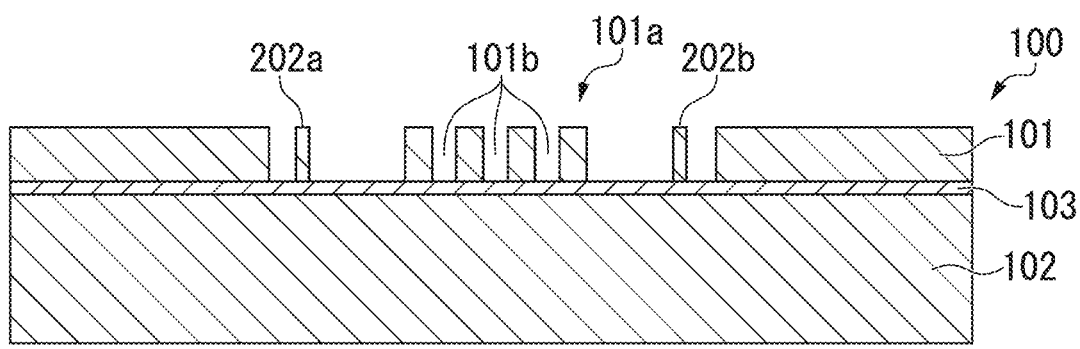

First, a mask M1 is formed in a predetermined shape on a device layer 101 of an SOI wafer 100 (FIG. 6A), and then anisotropic deep reactive ion etching (RIE) is carried out on the device layer 101 of the SOI wafer 100, thereby forming an uneven portion 101a extending in a direction perpendicular to a main surface of the SOI wafer 100 (FIG. 6B, step (A)).

The three-dimensional uneven structure of the present disclosure is formed of a thin layer having a high aspect ratio, and thus the etching speed of the device layer 101 which is a sacrifice layer (target layer) is preferably fast, and the etching speed ratio between the device layer 101 and an ALD layer described below is preferably 10,000:1 or more. For example, in a case where an etching gas is sulfur hexafluoride ($SF_6$), the etching speed ratio is 70,000.

Due to the present step, a plurality of slit-shaped groove portions 101b, 101b, . . . is formed in the device layer 101 of the SOI wafer 100. In addition, a pair of comb tooth portions 202a and 202b may be formed on both sides of the uneven portion 101a in addition to the uneven portion 101a.

Figure 6C:
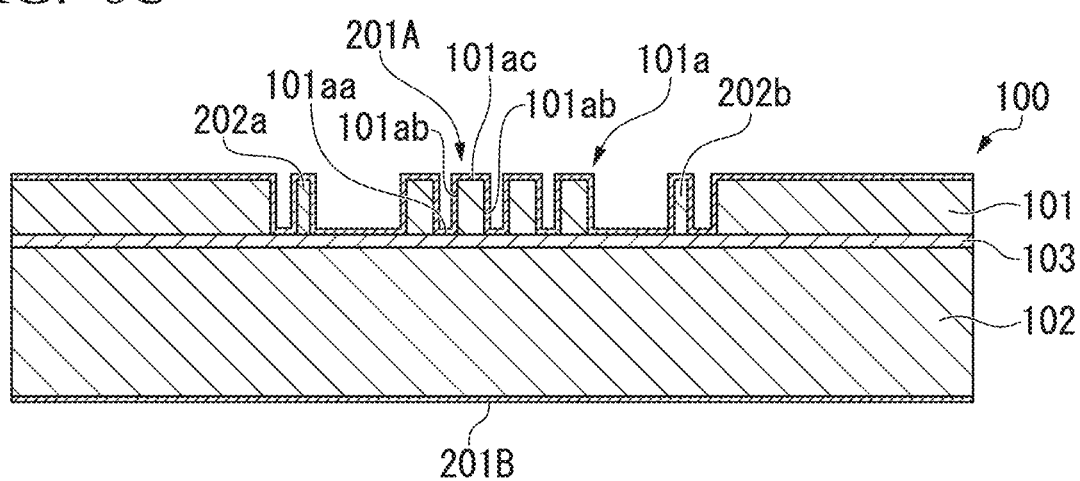

Next, a first layer 201A is conformally deposited on the uneven portion 101a by ALD (FIG. 6C, step (B)). In ALD, it is possible to coat the surface exposed by the deep etching without generating any uncovered regions, and it is possible to uniformly deposit the first layer 201A on a surface of the uneven portion 101a having the groove portions 101b with a high aspect ratio. In addition, from the viewpoint of the stiffness of a finally obtained three-dimensional uneven structure, the first layer 201A is more preferably formed by a dry process such as ALD than a wet process.

Figure 7:
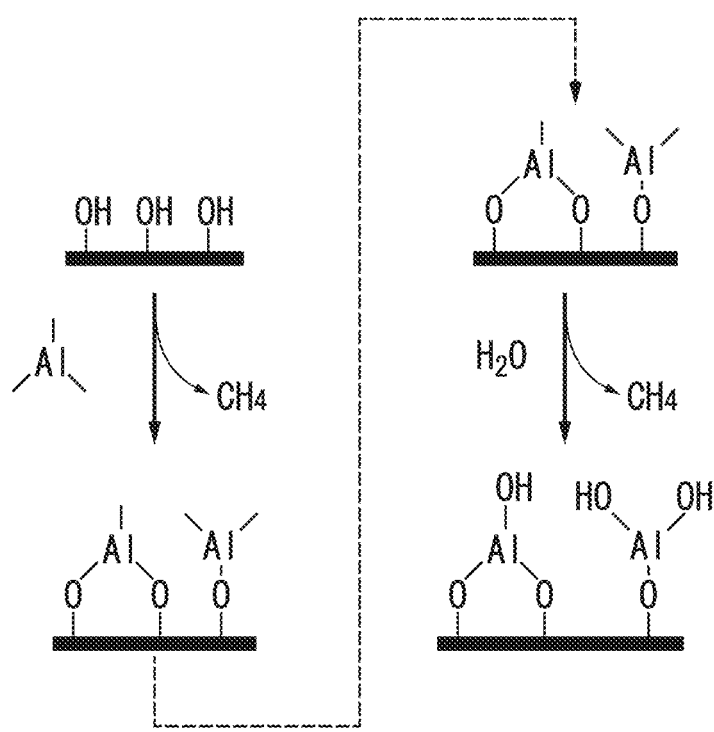
FIG. 7 is a schematic view for showing an ALD method that is used at the time of manufacturing the mirror device.

Specifically, as shown in FIG. 7, a film formation raw material (precursor) is adsorbed to the surface of the uneven portion 101a of the device layer 101 under a vacuum atmosphere. As the film formation raw material, for example, methyl aluminum (TMA) is an exemplary example. After purging, a reaction active species is supplied, and the film formation raw material and the reaction active species are reacted with each other. As the reaction active species, for example, water vapor ($H_2O$) is an exemplary example. After that, purging is carried out again, and a single atomic layer or a plurality of atomic layers is formed. In such a case, the first layer 201A can be laminated in increments of one atomic layer, and, for example, in a case where the first layer 201A is formed of aluminum oxide ($Al_2O_3$), it is possible to laminate the first layer in increments of one angstrom in thickness.

These layers are laminated by carrying out this cycle a number of times, and the first layer 201A is formed on a bottom surface 101aa, a side surface 101ab, and an upper surface 101ac of the uneven portion 101a. In addition, a first layer 201B is formed on the device layer 101 of the SOI wafer 100. The first layers 201A and 201B are formed of, for example, aluminum oxide. After the formation of the layers, an annealing treatment is preferably carried out on the first layer 201A.

In order to realize a high aspect ratio of the side wall portion, a selection ratio (selectivity) is preferably high. The selection ratio is represented by the ratio (speed ratio) of the etching speed of a material forming a sacrifice layer to the etching speed of a material forming a layer structure and is preferably 10,000 or more. For example, in a case where the sacrifice layer is silicon and the three-dimensional uneven structure is aluminum oxide, the selection ratio of silicon to aluminum oxide is 70,000. According to a combination of the above-described materials, an extremely high selectivity can be obtained, and it becomes possible to realize a high aspect ratio (for example, 8,000).

In the present embodiment, the first layers 201A and 201B are conformally deposited by ALD, but the method is not limited thereto, and the first layers 201A and 201B may be conformally deposited on the uneven portion 101a by MLD. In MLD, a single molecular layer or a plurality of molecular layers is formed, these layers are laminated together by carrying out this cycle a number of times, and the first layers 201A and 201B are formed. Alternatively, both an ALD layer and an MLD layer may be laminated on the uneven portion 101a, and both layers may be conformally deposited on the uneven portion 101a.

In addition, in the present embodiment, the first layers 201A and 201B are formed by the processes of ALD and/MLD, but the method is not limited thereto, and the first layers 201A and 201B may be formed by other processes such as LP-CVD with a condition of the obtainment of the above-described high aspect ratio.

Figure 8A:
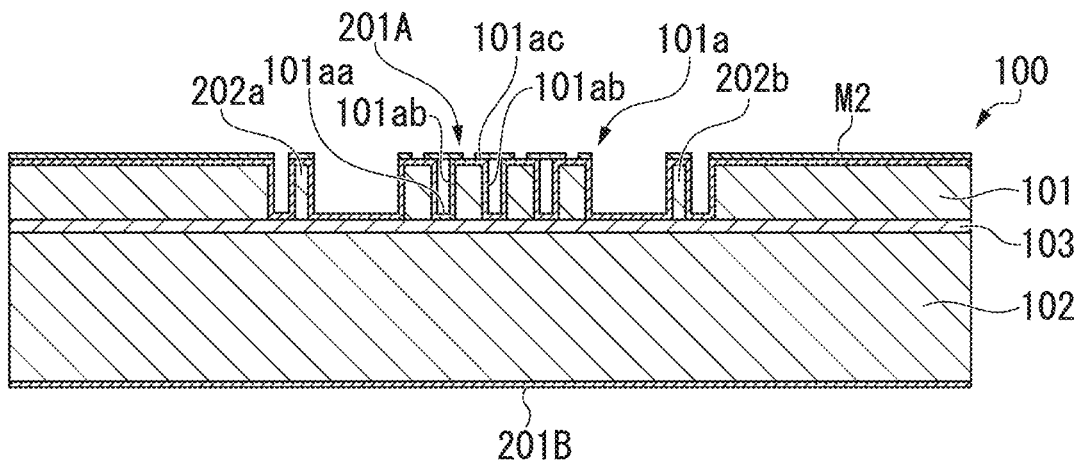
FIG. 8A to FIG. 8C are step views showing an example of a method for manufacturing the mirror device of FIG. 3.
Figure 8B:
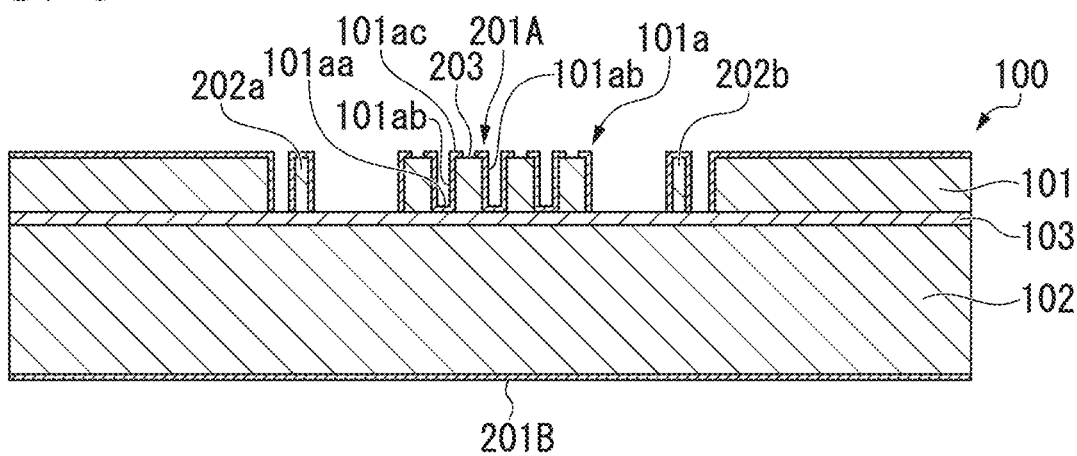

Next, a mask M2 such as a film resist having a predetermined resist pattern is formed on the device layer 101 of the SOI wafer 100 (FIG. 8A), and a through hole 203 is formed in the first layer 201A formed on the upper surface 101ac of the uneven portion 101a by anisotropic etching in which fast atom beams (FAB) or the like are used (FIG. 8B, step (C)).

Figure 8C:
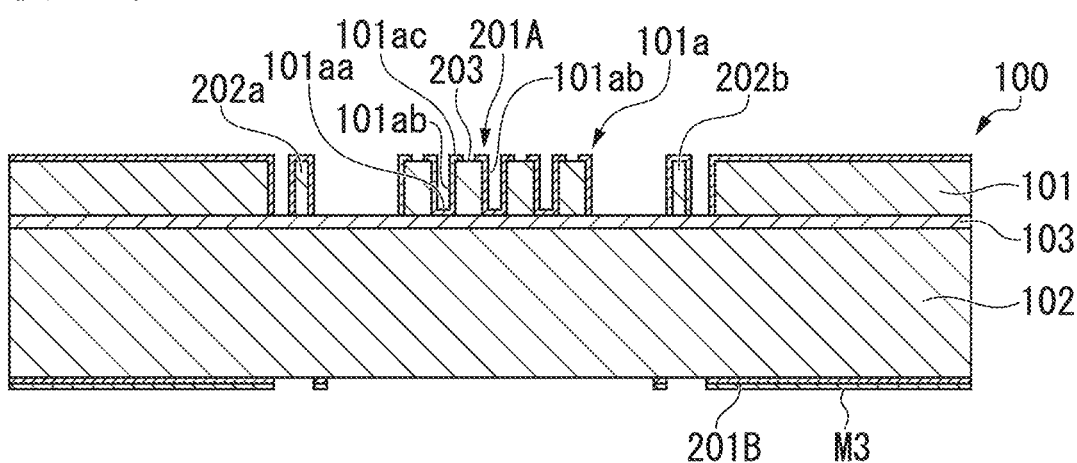

After that, a mask M3 is formed in a predetermined shape on a handle layer 102 of the SOI wafer 100, and the first layer 201B formed on the handle layer 102 is patterned by anisotropic etching in which fast atom beams (FAB) or the like are used (FIG. 8C, step (D)).

Figure 9A:
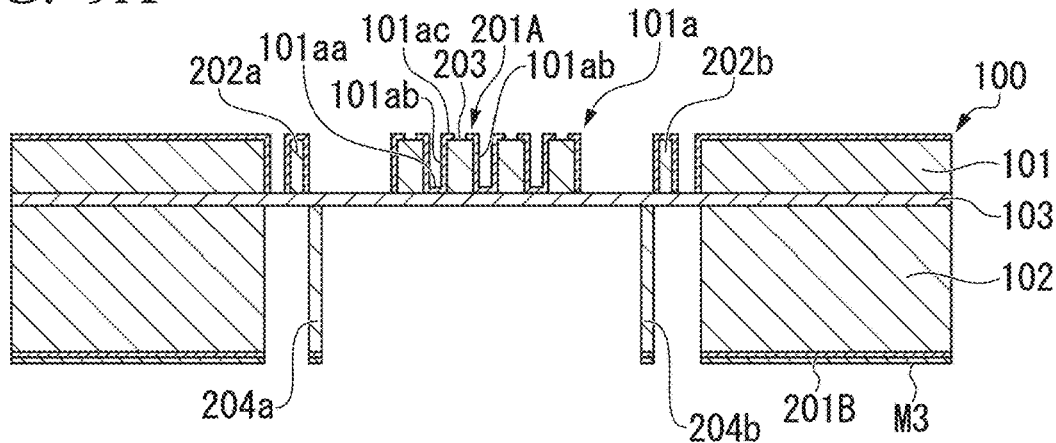
FIG. 9A to FIG. 9C are step views showing an example of a method for manufacturing the mirror device of FIG. 3.

Next, the handle layer 102 of the SOI wafer 100 is removed by anisotropic etching, thereby exposing an oxide layer 103 of the SOI water 100 (FIG. 9A, step (E)). At this time, a pair of comb tooth portions 204a and 204b which serves as a counter electrode of the pair of comb tooth portions 202a and 202b may be formed by carrying out anisotropic deep reactive ion etching (RIE) on the handle layer 102.

Figure 9B:
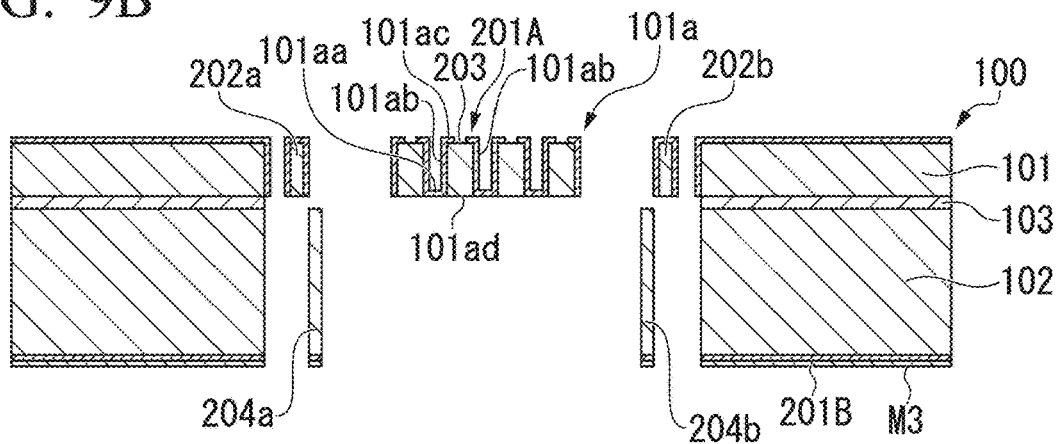

After that, the oxide layer 103 of the SOI wafer 100 is removed by anisotropic RIE, thereby exposing a lower surface 101ad of the uneven portion 101a (FIG. 9B, step (F)). At this time, the oxide layer 103 may be removed across a portion from right below the comb tooth portion 202a to right below the comb tooth portion 202b or only the oxide layer 103 located right below the uneven portion 101a may be removed.

Figure 9C:
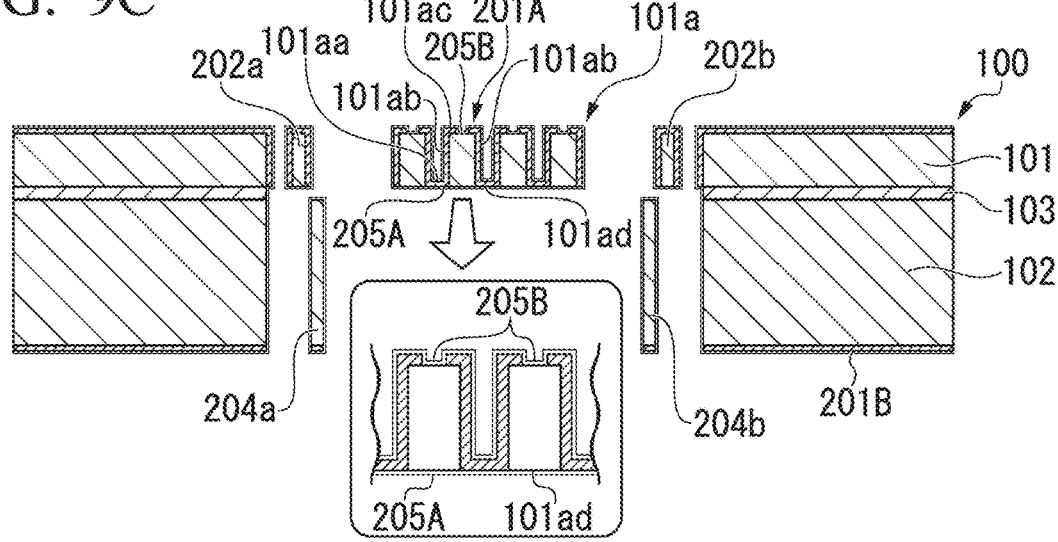

Next, a second layer 205A is conformally deposited on the first layer 201A and the lower surface 101ad of the uneven portion 101a by ALD (FIG. 9C, step (G)). In addition, due to the present step, a second layer 205B is formed in the through hole 203.

In the present embodiment, the second layers 205A and 205B are conformally deposited by ALD, but the method is not limited thereto, and the second layers 205A and 205B may be conformally deposited by ALD and/or MLD. In addition, the second layers 205A and 205B may be formed by other processes such as LP-CVD.

Figure 10A:
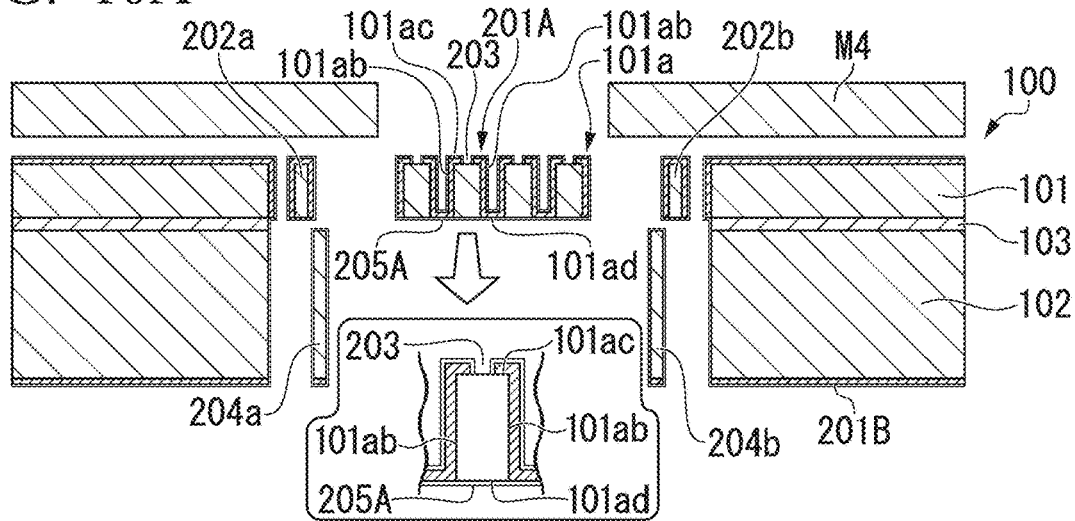
FIG. 10A to FIG. 10C are step views showing an example of a method for manufacturing the mirror device of FIG. 3.
Figure 10B:
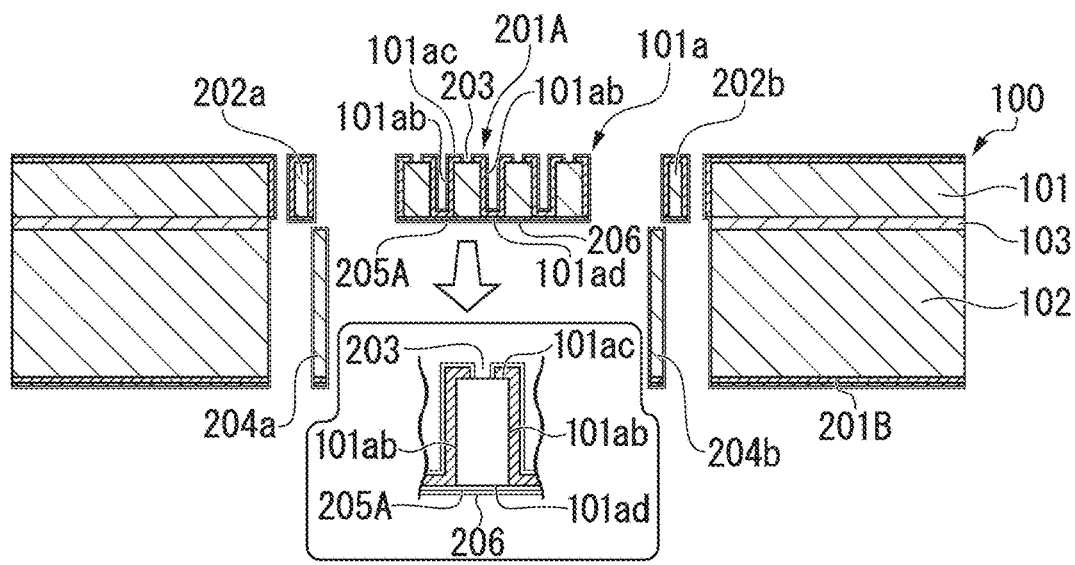

In addition, a mask M4 such as a stencil is disposed on the handle layer 102 of the SOI wafer 100 (FIG. 10A), and the second layer 205B formed in the through hole 203 is removed by anisotropic etching, thereby forming the through hole 203 again in the first layer 201A (FIG. 10A, step (H)).

Next, a metal s deposited on the second layer 205A from the handle layer 102 side of the SOI wafer 100, thereby forming a third layer 206 on the second layer 205A (FIG.

10B, step (I)). The third layer 206 is formed of, for example, aluminum. The third layer 206 is formed on the second layer 205A by, for example, a deposition method. The reflection portion 32B is formed from this third layer 206 (refer to FIG. 4B).

Figure 10C:
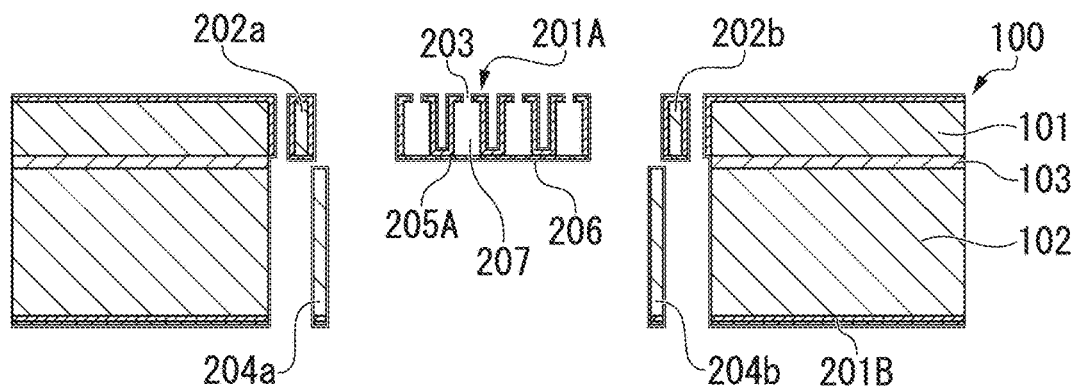

After that, the uneven portion 101*a* of the device layer 101 is removed through the through hole 203 by isotropic etching RIE (FIG. 10C, step (J)). For example, in a case where an etching gas is sulfur hexafluoride ($SF_6$), a F atom generated from $SF_6$ reacts with silicon (Si) forming the uneven portion 101*a* to produce $SiF_4$ having a high vapor pressure, and $SiF_4$ is discharged through the through hole 203. Therefore, a hollow portion 207 that is defined by the first layer 201A and the second layer 205A is formed. That is, due to the present step, the base portion 31B including the bottom wall portion 311B, the first side wall portion group 312BB formed of the plurality of pairs of first side wall portions 312Ba and 312Bb, and the first upper wall portion group 314BB formed of the plurality of first upper wall portions 314B is formed (refer to FIG. 4B), whereby the mirror device 1B is obtained.

Furthermore, in the step (C) (FIG. 8A and FIG. 8B), a portion of the first layer 201A formed on the upper surface 101*ac* of the uneven portion 101*a* may be removed by anisotropic etching in which fast atom beams (FAB) or the like are used, and a through groove may be formed along an extension direction of the upper surface 101*ac* so that all of the upper surface 101*ac* is exposed. Therefore, portions of the first layer 201A formed on both side surfaces 101*ab* and 101*ab* of the uneven portion 101*a* are separated from each other. In addition, the second layer formed in the through groove is removed by subsequent anisotropic etching to form a through groove again (step (I)), and the uneven portion 101*a* is removed through the through groove by isotropic RIE (step (J)). Therefore, it is possible to obtain the mirror device 1A having a plurality of side wall portions (for example, a plurality of fins) (FIG. 1).

As described above, according to the present embodiment, the base portion 31B includes the bottom wall portion 311B, the first side wall portion group 312BB formed of the plurality of pairs of first side wall portions 312Ba and 312Bb, and the first upper wall portion group 314BB formed of the plurality of first upper wall portions 314B, and thus it is possible to further suppress the dynamic deformation of the reflection member 30B while increasing the operation frequency, the optical scanning angle, and the diameter of the reflection member 30B to be larger than in the related art, and it is possible to further improve the resolution of scanning laser devices.

Figure 11A:
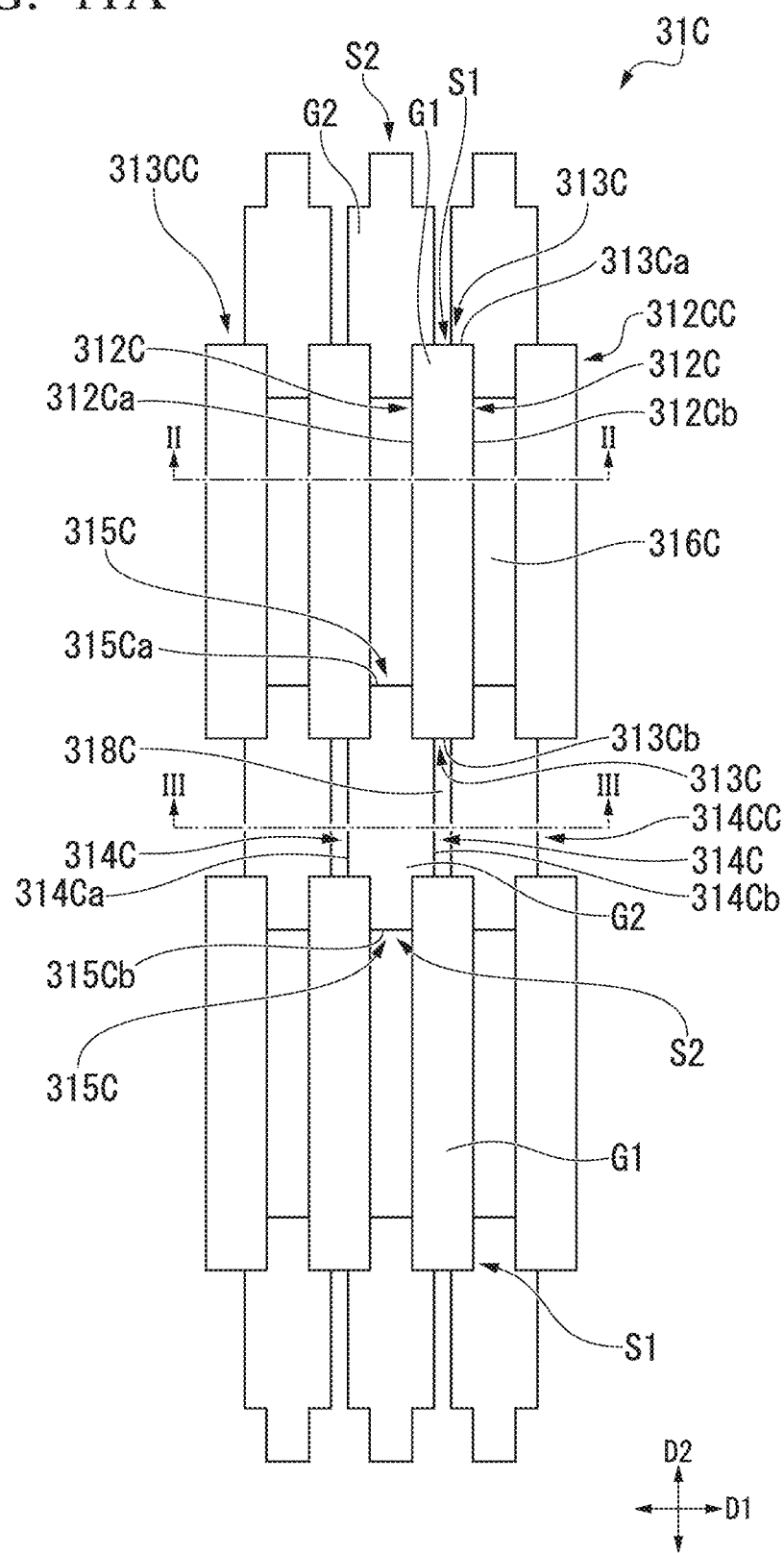
FIG. 11A is a partial plan view showing a modification example of a base portion of FIG. 3.
Figure 11B:
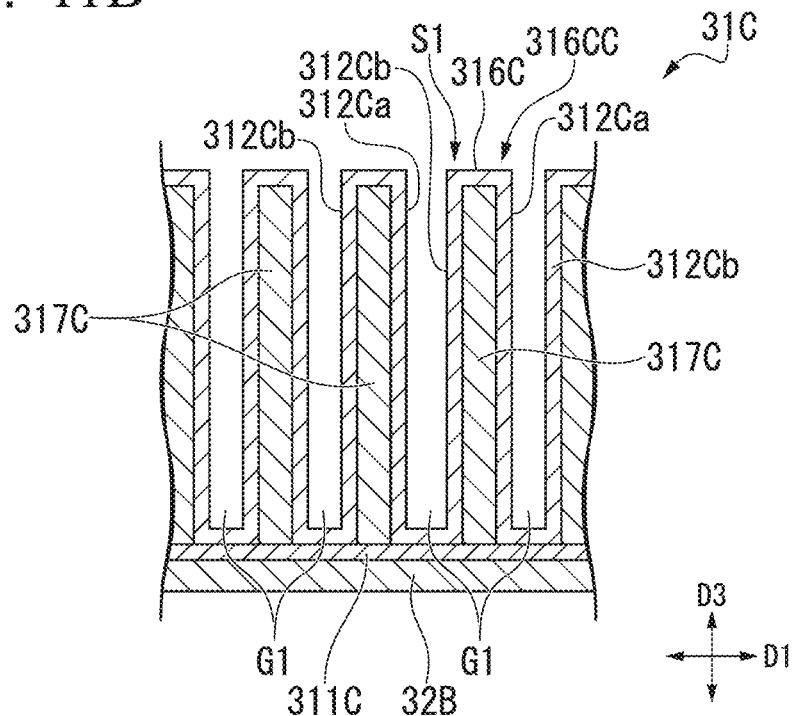
FIG. 11B is a cross-sectional view in a direction of a line II-II of FIG. 11A.
Figure 11C:
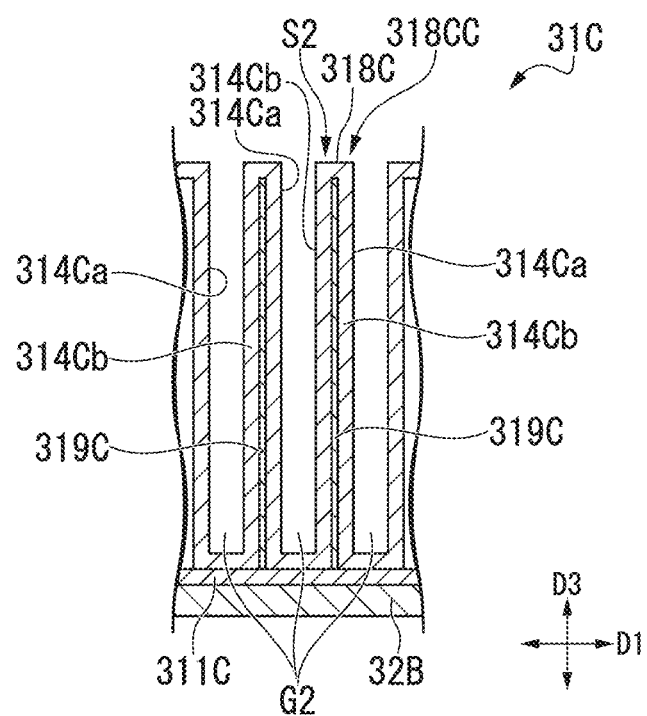
FIG. 11C is a cross-sectional view in a direction of a line III-III of FIG. 11A.

FIG. 11A is a partial plan view showing a modification example of the base portion 31B of FIG. 3, FIG. 11B is a cross-sectional view in a direction of a line II-II of FIG. 11A, and FIG. 11C is a cross-sectional view in a direction of a line III-III of FIG. 11A. The same configuration as the mirror device 1B of FIG. 3 will be given the same reference sign and will not be described again. In addition, materials of individual configurational elements of a base portion of FIG. 11A are basically the same as the materials of the respective configurational elements of the base portion 31B of FIG. 3 and thus will not be described again.

As shown in FIG. 11A to FIG. 11C, a base portion 31C has a plurality of first shell-shaped structures S1, S1, . . . disposed in a matrix shape in a plan view of the base portion 31C and a plurality of second shell-shaped structures S2, S2, . . . that is disposed in a matrix shape in the plan view of the base portion 31C and couples the adjacent first shell-shaped structures S1, S1, . . . . The first shell-shaped structure S1 defines a substantially quadratic prism-shaped void portion G1, and the second shell-shaped structure S2 defines a substantially polygonal column-shaped void portion G2. In addition, the plurality of first shell-shaped structures S1, S1, . . . and the plurality of second shell-shaped structures S2, S2, . . . are coupled to each other to form a single shell-shaped structure.

The first shell-shaped structure S1 has a plurality of first side wall portions 312C and 312C provided side by side in the first direction (D1 direction) and third side wall portions 313C and 313C provided side by side in a second direction (D2 direction) intersecting the first direction. In addition, the second shell-shaped structure S2 has first side wall portions 314C and 314C provided side by side in the first direction (D1 direction) and third side wall portions 315C and 315C provided side by side in the second direction (D2 direction) intersecting the first direction. That is, the base portion 31C in the present modification example has a three-dimensional uneven structure including the first side wall portions 312C and 314C and the third side wall portions 313C and 315C (a plurality of side wall portions) extending from the bottom wall portion 311B opposite to the reflection portion 32B.

Specifically, the base portion 31C includes a first side wall portion group 312CC formed of a bottom wall portion 311C and a plurality of pairs of first side wall portions 312Ca and 312Cb extending in the first direction (D2 direction) in the plan view of the base portion 31C and a third side wall portion group 313CC formed of a plurality of pairs of third side wall portions 313Ca and 313Cb that extends in the second direction (D1 direction) intersecting the first direction and couples the pairs of first side wall portions 312Ca and 312Cb. In the present modification example, the first side wall portion group 312CC and the third side wall portion group 313CC are disposed in a grid shape in the plan view of the base portion 31C.

In addition, the base portion 31C includes a first side wall portion group 314CC formed of a plurality of pairs of first side wall portions 314Ca and 314Cb extending in the first direction (D2 direction) in the plan view of the base portion 31C and a third side wall portion group 315CC formed of a plurality of pairs of third side wall portions 315Ca and 315Cb extending in the second direction (D1 direction) intersecting the first direction. In the present modification example, the first side wall portion group 314CC and the third side wall portion group 315CC are disposed in a grid shape in the plan view of the base portion 31C.

The base portion 31 includes a third upper wall portion group 316CC formed of a plurality of third upper wall portions 316C that is defined by two adjacent first side wall portions 312Ca and 312Cb and two adjacent third side wall portions 315Ca and 315Cb in the plan view of the base portion 31C. A region surrounded by the bottom wall portion 311C, the adjacent first side wall portions 312Ca and 312Cb, the adjacent third side wall portions 315Ca and 315Cb, and the third upper wall portion 316C forms a solid protrusion portion 317C.

In the third upper wall portion 316C, one or a plurality of through holes, not shown, may be provided. In such a case, the region surrounded by the bottom wall portion 311C, the adjacent first side wall portions 312Ca and 312Cb, the adjacent third side wall portions 315Ca and 315Cb, and the third upper wall portion 316C forms a third hollow portion. In such a case, it is possible to further reduce the weight of the reflection member 30C.

In addition, the base portion 31 includes a third upper wall portion group 318CC formed of a plurality of third upper wall portions 318C that is defined by two adjacent first side wall portions 314Ca and 314Cb and two adjacent third side wall portions 313Ca and 313Cb in the plan view of the base portion 31C (FIG. 11C). A region surrounded by the bottom wall portion 311C, the adjacent first side wall portions 314Ca and 314Cb, the adjacent third side wall portions 313Ca and 313Cb, and the third upper wall portion 318C forms a solid protrusion portion 319C.

In the third upper wall portion 318C, one or a plurality of through holes, not shown, may be provided. In such a case, the region surrounded by the bottom wall portion 311C, the adjacent first side wall portions 314Ca and 314Cb, the adjacent third side wall portions 313Ca and 313Cb, and the third upper wall portion 318C forms another third hollow portion. In such a case, it is possible to further reduce the weight of the reflection member 30C.

In the present modification example, for example, in the method for manufacturing a mirror device, the step (A) to the step (J) is regarded as one cycle, in the first cycle, the plurality of first shell-shaped structures S1, S1, . . . is formed, and in the second cycle, the plurality of second shell-shaped structures S2, S2, . . . is formed. Therefore, it is possible to manufacture a mirror device having the base portion 31C.

According to the present modification example, the base portion 31C includes the third side wall portion group 313CC formed of the plurality of pairs of third side wall portions 313Ca and 313Cb that extends in the second direction (D1 direction) intersecting the first direction and the third side wall portion group 315CC formed of the plurality of pairs of third side wall portions 315Ca and 315Cb extending in the second direction (D1 direction), and thus it is possible to further improve the stiffness of the base portion 31C against stress in the D3 direction, and it is possible to improve the stiffness of the base portion 31C against stress in the in-plane direction that is regulated by the D1 direction and the D2 direction.

Figure 12A:
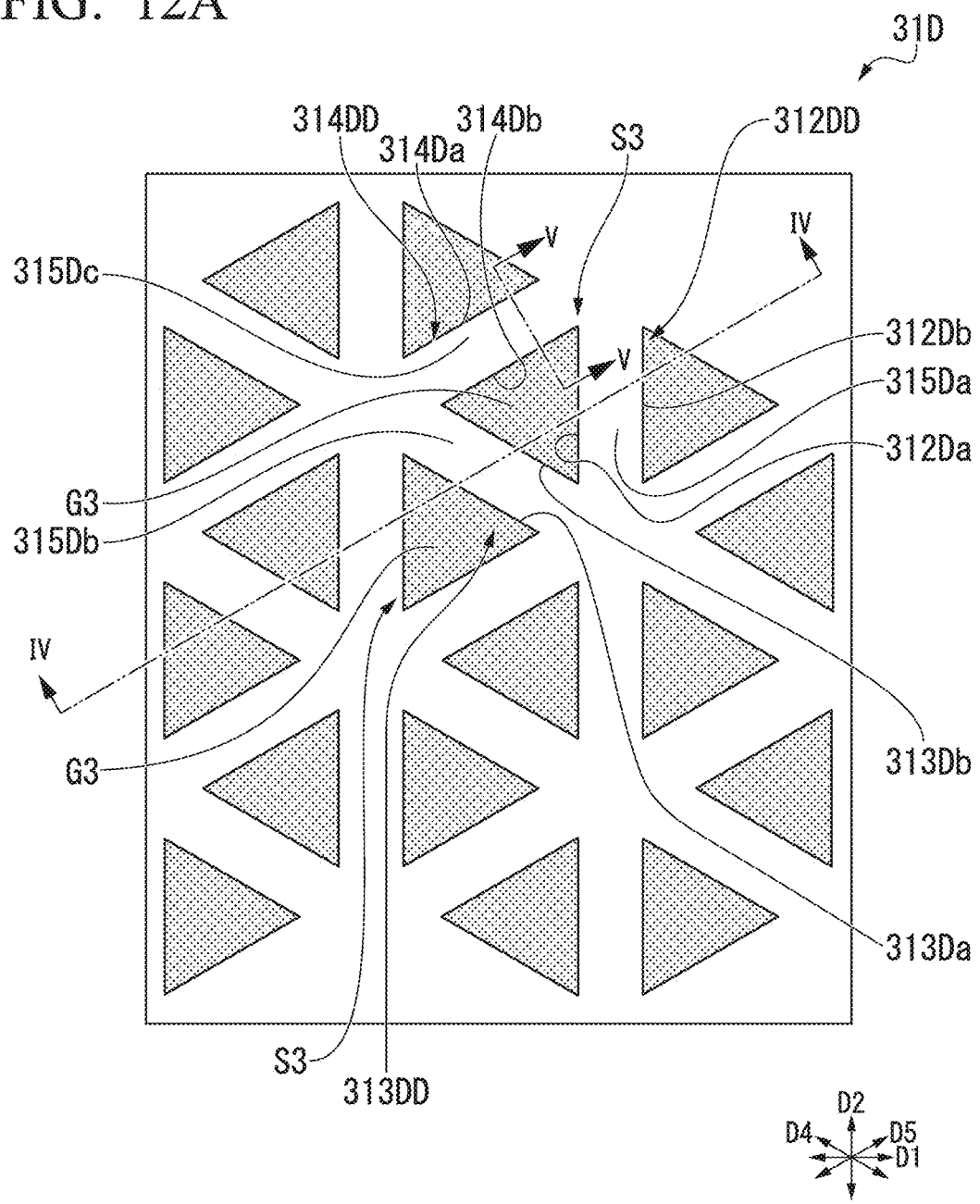
FIG. 12A is a partial plan view showing another modification example of the base portion of FIG. 3.
Figure 12B:
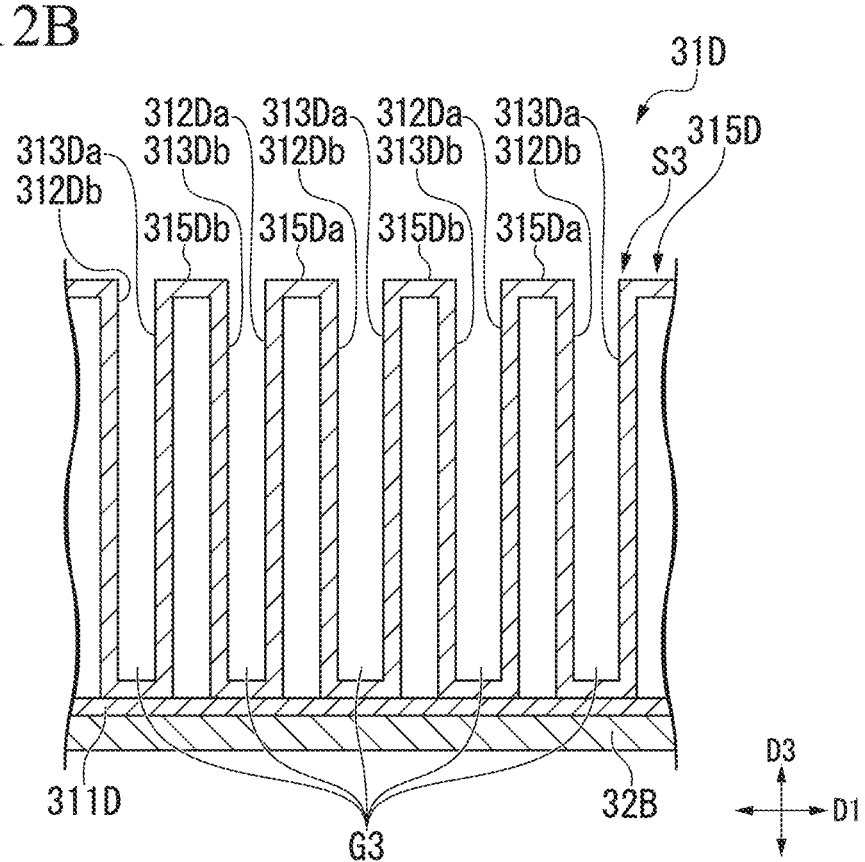
FIG. 12B is a cross-sectional view in a direction of a line IV-IV of FIG. 12A.
Figure 12C:
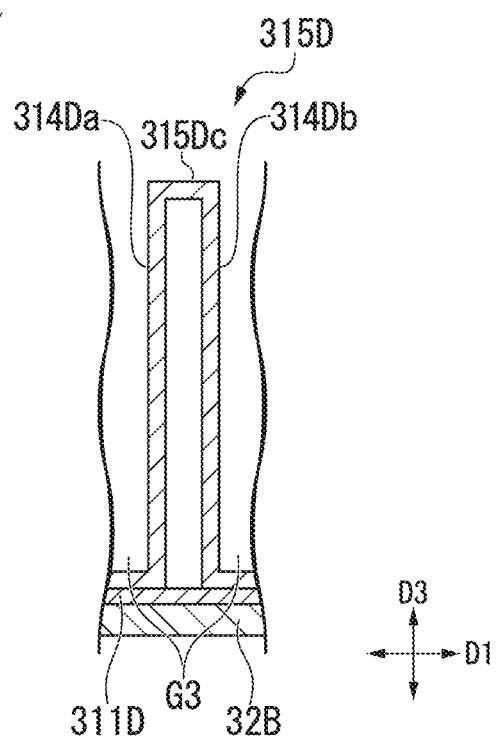
FIG. 12C is a cross-sectional view in a direction of a line V-V of FIG. 12A.

FIG. 12A is a partial plan view showing another modification example of the base portion 31B of FIG. 3, FIG. 12B is a cross-sectional view in a direction of a line IV-IV of FIG. 12A, and FIG. 12C is a cross-sectional view in a direction of a line V-V of FIG. 12A. Materials of individual configurational elements of a base portion of FIG. 12A are basically the same as the materials of the respective configurational elements of the base portion 31B of FIG. 3 and thus will not be described again.

As shown in FIG. 12A to FIG. 12C, a base portion 31D has a plurality of third shell-shaped structures S3, S3, . . . disposed in a matrix shape in a plan view of the base portion 31D. The third shell-shaped structure S3 defines a substantially triangular prism-shaped void portion G3.

Basically, the base portion 31D includes a first side wall portion group 312DD formed of a bottom wall portion 311D and a plurality of pairs of first side wall portions 312Da and 312Db extending in the first direction (D2 direction) in the plan view of the base portion 31D, a third side wall portion group 313DD formed of a plurality of pairs of third side wall portions 313Da and 313Db extending in the second direction (D4 direction) intersecting the first direction, and a fourth side wall portion group 314DD formed of a plurality of pairs of fourth side wall portions 314Da and 314Db extending in a third direction (D5 direction) intersecting both the first direction and the second direction.

The first side wall portion group 312DD, the third side wall portion group 313DD, and the fourth side wall portion group 314DD form a truss-shaped structure in the plan view of the base portion 31D. That is, any of the pair of first side wall portion 312Da and 312Db, any of the pair of third side wall portion 313Da and 313Db, and any of the pair of fourth side wall portion 314Da and 314Db form three sides of a triangular shape in the plan view of the base portion 31D.

In the present modification example, any of the pair of adjacent first side wall portions 312Da and 312Db, any of the pair of third side wall portion 313Da and 313Db, and any of the pair of fourth side wall portion 314Da and 314Db are coupled to one another. In addition, the first side wall portion, the second side wall portion, and the third side wall portion forming three sides of a triangular shape are disposed so that the portions intersect each other at 60 degrees in the plan view of the base portion 31D and form the third shell-shaped structure S3 having a substantially equilateral triangular prism shape. In addition, this third shell-shaped structure S3 is used as a unit, and the plurality of third shell-shaped structures S3, S3, . . . is disposed in a matrix shape in the plan view of the base portion 31D. As described above, the plurality of third shell-shaped structures S3, S3, . . . forms a shell-shaped structure array.

In addition, the base portion 31D includes a fourth upper wall portion 315D that is defined by the first side wall portion group 312DD, the third side wall portion group 313DD, and the fourth side wall portion group 314DD in the plan view of the base portion 31D. The fourth upper wall portion 315D couples the first side wall portion group 312DD, the third side wall portion group 313DD, and the fourth side wall portion group 314DD.

According to the present modification example, the base portion includes the third side wall portion group 313DD formed of the plurality of pairs of third side wall portions 313Da and 313Db extending in the second direction (D4 direction) intersecting the first direction and the fourth side wall portion group 314DD formed of the plurality of pairs of fourth side wall portions 314Da and 314Db extending in the third direction (D5 direction) intersecting both the first direction and the second direction, and thus it is possible to further improve the stiffness of the base portion 31D against stress in the D3 direction, and it is possible to improve the stiffness of the base portion 31D against stress in the in-plane direction that is regulated by the D1 direction and the D2 direction.

Figure 13A:
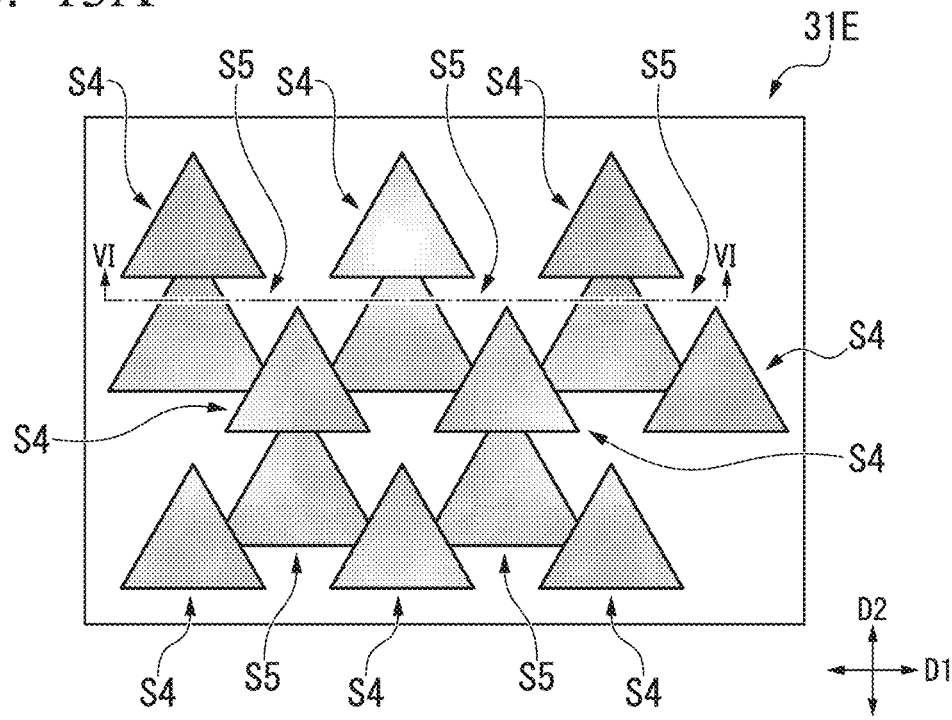
FIG. 13A is a partial plan view showing another modification example of the base portion of FIG. 3.
Figure 13B:
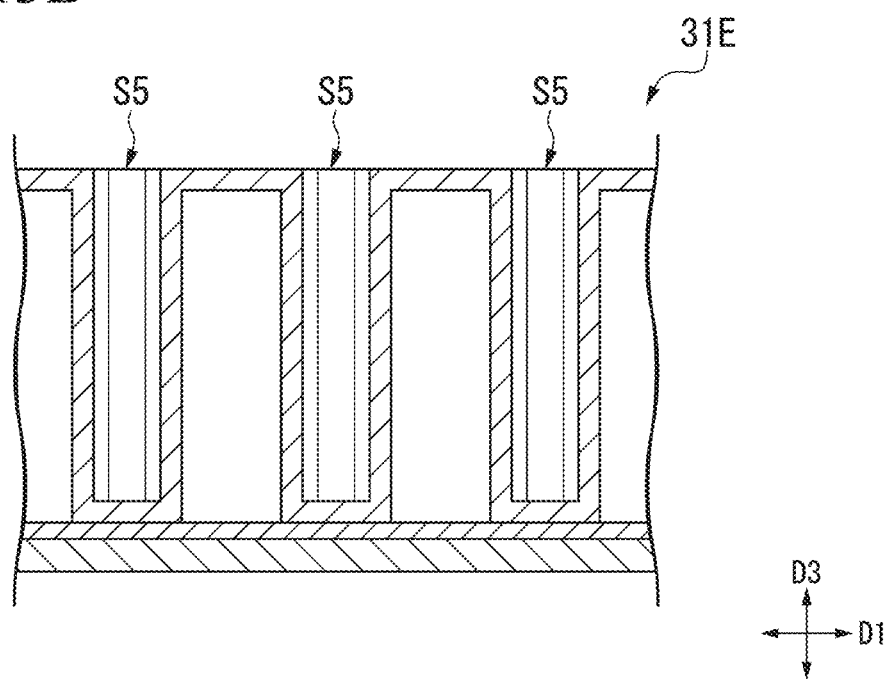
FIG. 13B is a cross-sectional view in a direction of a line VI-VI of FIG. 13A.

FIG. 13A is a partial plan view showing another modification example of the base portion 31B of FIG. 3, and FIG. 13B is a cross-sectional view in a direction of a line VI-VI of FIG. 13A. Materials of individual configurational elements of a base portion of FIG. 13A are basically the same as the materials of the respective configurational elements of the base portion 31B of FIG. 3 and thus will not be described again.

As shown in FIG. 13A and FIG. 13B, a base portion 31E has a plurality of third shell-shaped structures S4 which is a unit and a plurality of third shell-shaped structures S5 which is another unit. The plurality of third shell-shaped structures S4, S4, . . . is disposed in a matrix shape in a plan view of the base portion 31E, and the plurality of third shell-shaped structures S5, S5, . . . is also disposed in a matrix shape in a plan view of the base portion 31E. In addition, the plurality of third shell-shaped structures S4, S4, . . . and the plurality of third shell-shaped structures S5, S5, . . . are coupled to each other to form a single shell-shaped structure.

The third shell-shaped structure S4 defines a substantially triangular prism-shaped void portion G4, and the third shell-shaped structure S5 defines a substantially polygonal column-shaped void portion G2. In the present modification example, the area of the third shell-shaped structure S4 is smaller than the area of the third shell-shaped structure S5 in the plan view of the base portion 31E, but is not limited thereto and may be the same as the area of the third shell-shaped structure S5.

According to the present modification example, the plurality of third shell-shaped structures S4, S4, . . . and the plurality of third shell-shaped structures S5, S5, . . . are coupled to each other to form a single shell-shaped structure, and thus it is possible to further improve the stiffness of the base portion 31E against stress in the D3 direction, and it is possible to improve the stiffness of the base portion 31E against stress in the in-plane direction that is regulated by the D1 direction and the D2 direction.

Figure 14A:
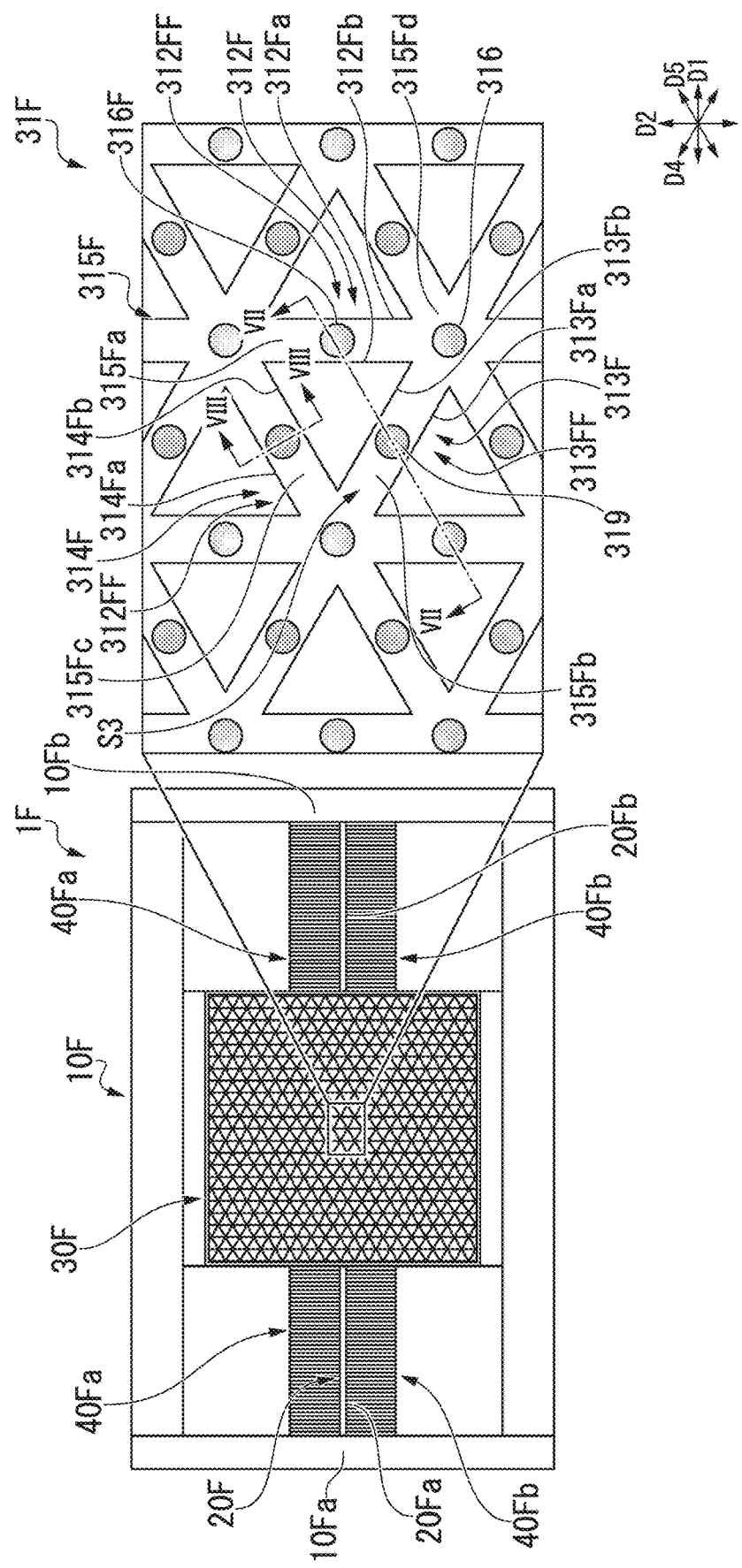
FIG. 14A is a plan view showing a modification example of the mirror device of FIG. 3.
Figure 14B:
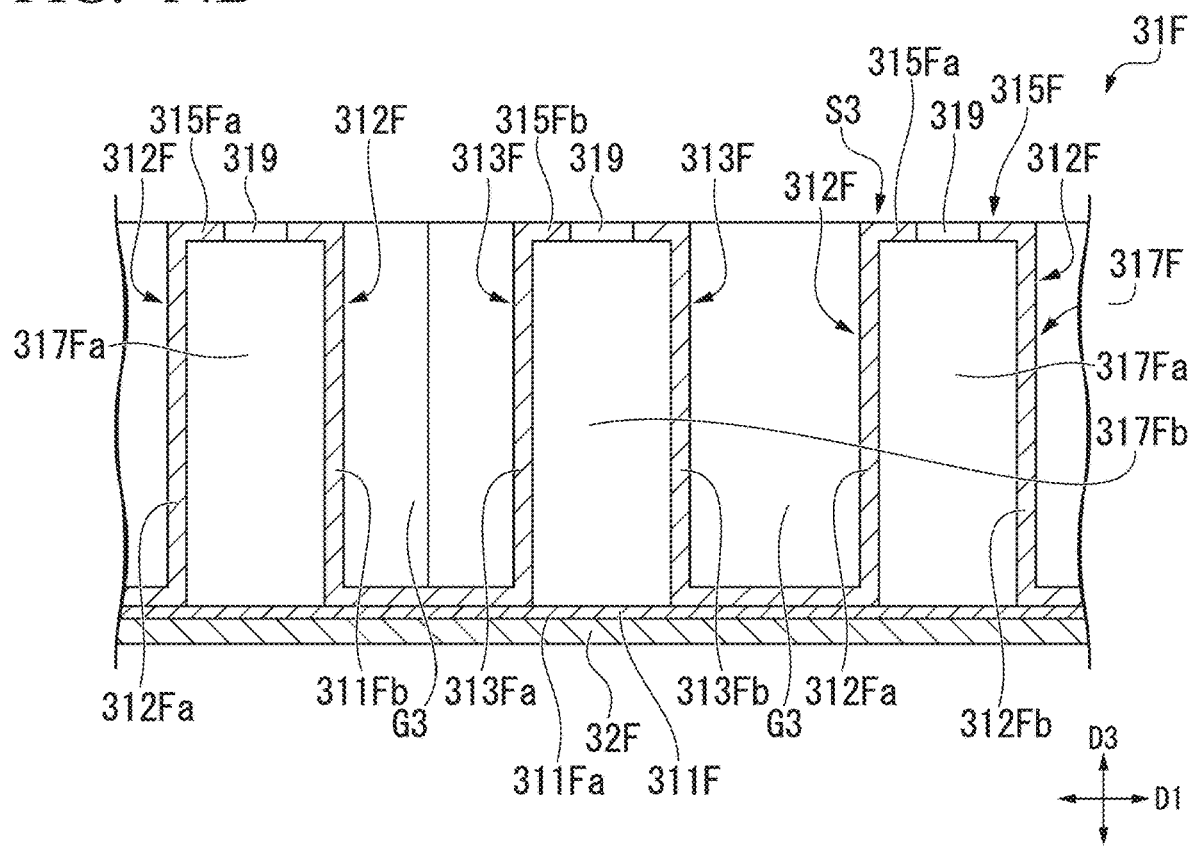
FIG. 14B is a cross-sectional view in a direction of a line VII-VII of FIG. 14A.
Figure 14C:
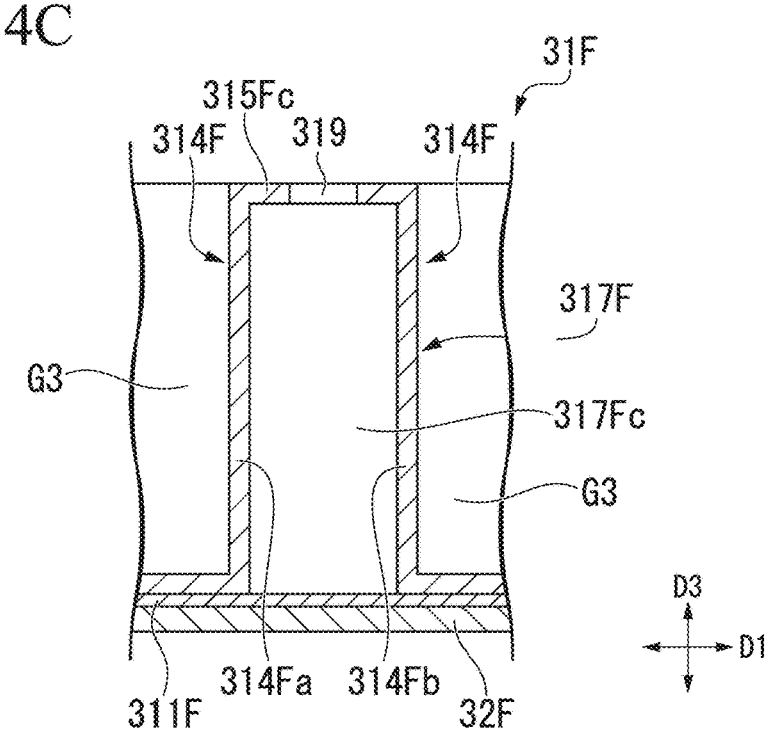
FIG. 14C is a cross-sectional view in a direction of a line of FIG. 14A.
Figure 15A:
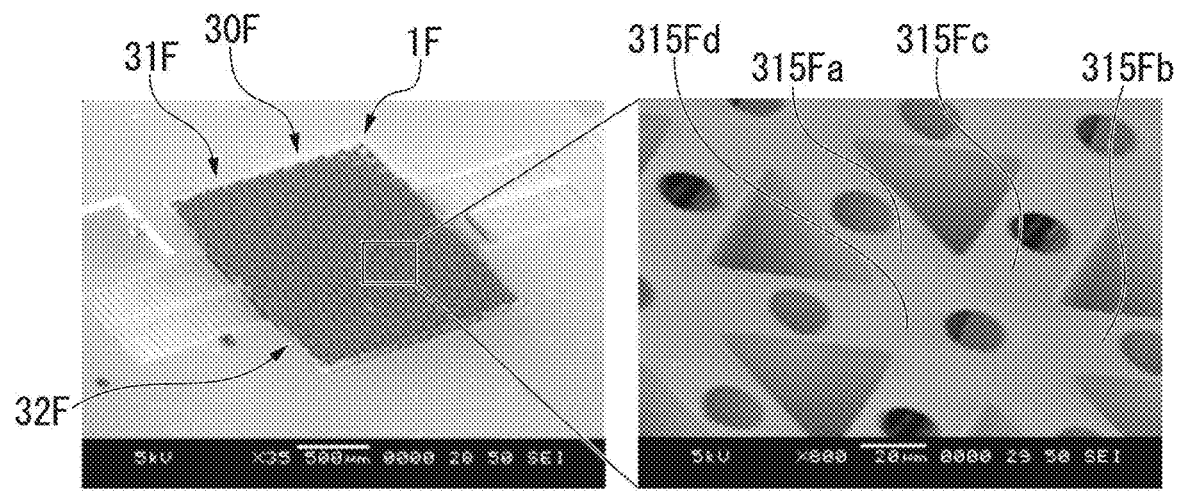
FIG. 15A is an electron microscope image of the mirror device of FIG. 14A.
Figure 15B:
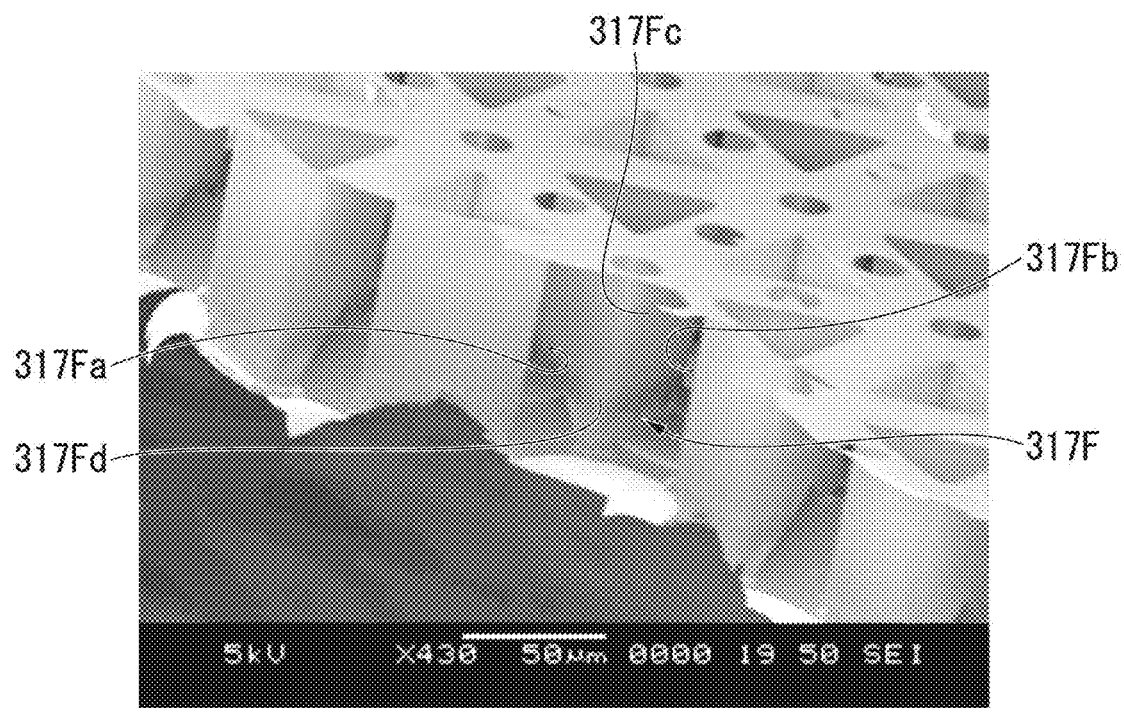
FIG. 15B is a partial cross-sectional image of FIG. 15A.

FIG. 14A is a plan view showing a modification example of the mirror device 1B of FIG. 3, FIG. 14B is a cross-sectional view in a direction of a line VII-VII of FIG. 14A, and FIG. 14C is a cross-sectional view in a direction of a line VIII-VIII of FIG. 14A. In addition, FIG. 15A is an electron microscope image of the mirror device of FIG. 14A, and FIG. 15B is a partial cross-sectional image of FIG. 15A. Materials and functions of individual configurational elements of a mirror device of the present modification example are basically the same as the materials and functions of the respective configurational elements of the mirror device 1B of FIG. 3 and thus will not be described again.

As shown in FIG. 14A, a mirror device 1F includes a frame body 10F, a shaft member 20F provided inside the frame body 10F and connected to the frame body 10F, a reflection member 30F fixed to the shaft member 20F and provided so as to be capable of swinging around an axis of the shaft member 20F, and a pair of comb tooth portions 40Fa and 40Fb provided in the shaft member 20F.

The frame body 10F is disposed along the in-plane direction that is regulated by the D1 direction and the D2 direction and has a substantially rectangular shape in a plan view of the mirror device 1F. The frame body 10F has a length (D1 direction) of 100 µm or more and 5,000 µm or less and a width (D2 direction) of 100 µm or more and 5,000 µm or less. As an example, the frame body 10F is 4,000 µm in length and 3,000 µm in width.

The shaft member 20F has a first shaft portion 20Fa that couples, between a pair of facing frame portions 10Fa and 10Fb, the frame portion 10Fa and the reflection member 30F and a second shaft portion 20Fb that couples the frame portion 10Fb and the reflection member 30F. The shaft member 20F is integrally formed with, for example, a base portion 31F, described below, of the reflection member 30F. The shaft member 20F has, for example, a substantially rectangular shape in a cross-sectional view in the width direction (D2 direction).

As shown in FIG. 14B and FIG. 14C, the reflection member 30F has the base portion 31F provided along the axial direction (D1 direction) of the shaft member 20F and a reflection portion 32F provided on the base portion. This base portion 31F has a three-dimensional uneven structure including a bottom wall portion 311F having a main surface 311Fa provided along the axial direction (D1 direction) of the shaft member 20F and a first side wall portions 312F, a second side wall portion 313F, and a second side wall portion 314F (a plurality of side wall portions) which extend from the bottom wall portion 311F opposite to the reflection portion 32F.

The base portion 31F is substantially a cuboid and has, for example, a length (D1 direction) of 100 µm or more and 5,000 µm or less, a width (D2 direction) of 100 µm or more and 5,000 µm or less, and a height (D3 direction) of 10 µm or more and 2,000 µm or less. As an example, the base portion 31F is 2,000 µm in length, 2,000 µm in width, and 679 µm in height.

The base portion 31F includes a first side wall portion group 312FF formed of a bottom wall portion 311F and a plurality of pairs of first side wall portions 312Fa and 312Fb extending in the first direction (D2 direction) the plan view of the base portion 31F, a third side wall portion group 313FF formed of a plurality of pairs of third side wall portions 313Fa and 313Fb extending in the second direction (D4 direction) intersecting the first direction, a fourth side wall portion group 314FF formed of a plurality of pairs of fourth side wall portions 314Fa and 314Fb extending in the third direction (D5 direction) intersecting both the first direction and the second direction, and a first side wall portion group 312FF.

In the present modification example, similar to the modification example of FIG. 12A, the first side wall portion group 312FF, the third side wall portion group 313FF, and the fourth side wall portion group 314FF form a truss-shaped structure in the plan view of the base portion 31F. That is, any of the pair of first side wall portion 312Fa and 312Fb, any of the pair of third side wall portion 313Fa and 313Fb, and any of the pair of fourth side skull portion 314Fa and 314Fb form three sides of a triangular shape in the plan view of the base portion 31F.

In addition, any of the pair of adjacent first side wall portions 312Fa and 312Fb, any of the pair of third side wall portion 313Fa and 313Fb, and any of the pair of fourth side wall portion 314Fa and 314Fb are coupled to one another. In the present modification example, the first side wall portion, the second side wall portion, and the third side wall portion forming three sides of a triangular shape are disposed so that the portions intersect each other at 60 degrees in the plan view of the base portion 31F and form the third shell-shaped structure S3 having a substantially equilateral triangular prism shape. In addition, this third shell-shaped structure S3 is used as a unit, and the plurality of third shell-shaped structures S3, S3, . . . is disposed in a matrix shape in the plan view of the base portion 31F. As described above, the plurality of third shell-shaped structures S3, S3, . . . forms a shell-shaped structure array. In addition, the third shell-shaped structure S3 defines a void portion G3 having a substantially equilateral triangular prism shape.

In addition, the base portion 31F includes a fourth upper wall portion 315F that is defined by the first side wall portion group 312FF, the third side wall portion group 313FF, and the fourth side wall portion group 314FF in the plan view of the base portion 31F. The fourth upper wall portion 315F is formed of a first portion 315Fa located between the pair of first side wall portions 312Fa and 312Fb, a second portion 315Fb located between the pair of third side wall portions 313Fa and 313Fb, a third portion 315Fc located between the pair of fourth side wall portions 314Fa and 314Fb, and a fourth portion 315Fd that the first portion 315Fa, the second portion 315Fb, and the third portion 315Fc of the fourth upper wall portion 315F intersect (FIG. 14A to FIG. 14C).

In the fourth upper wall portion 315F, a plurality of through holes 319, 319, . . . is provided. For example, in each of the first portion 315Fa, the second portion 315Fb, the third portion 315Fc, and the fourth portion 315Fd of the fourth upper wall portion 315F, the through holes 319 are provided.

Furthermore, in the present modification example, the base portion 31F has a fourth hollow portion 317F formed of a first portion 317Fa, a second portion 317Fb, a third portion 317Fc, and a fourth portion 317Fd (FIG. 14B, FIG.

14C, and FIG. 15B). The bottom wall portion 311F, the pair of first side wall portions 312Fa and 312Fb, and the first portion 315Fa of the fourth upper wall portion 315F define the first portion 317Fa of the fourth hollow portion 317F. Similarly, the bottom wall portion 311F, the pair of third side wall portions 313Fa and 313Fb, and the second portion 315Fb of the fourth upper wall portion 315F define the second portion 317Fb of the fourth hollow portion 317F. In addition, the bottom wall portion 311F, the pair of fourth side wall portions 314Fa and 314Fb, and the third portion 315Fc of the fourth upper wall portion 315F define the third portion 317Fc of the fourth hollow portion 317F. Furthermore, the fourth portion 317Fd of the fourth hollow portion 317F is provided right below the fourth portion 315Fd that the first portion 315Fa, the second portion 315Fb, and the third portion 315Fc of the fourth upper wall portion 315F intersect (FIG. 15A and FIG. 15B). The fourth portion 317Fd communicates the first portion 317Fa, the second portion 317Fb, and the third portion 317Fc of the fourth upper wall portion 317F together. That is, the first portion 317Fa, the second portion 317Fb, the third portion 317Fc, and the fourth portion 317Fd are integrally formed. The fourth hollow portion 317F provided in the base portion 31F as described above enables the additional reduction of the weight of the reflection member 30C.

Figure 16A:
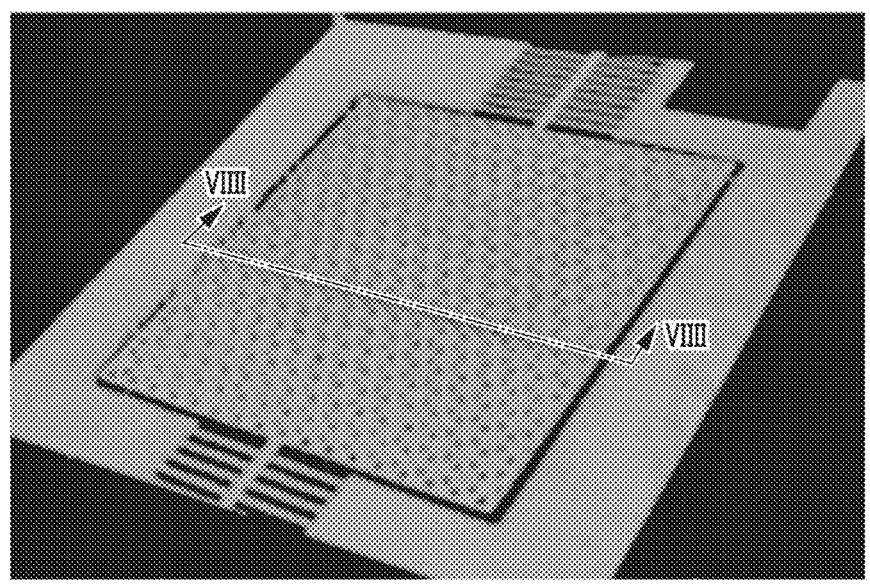
FIG. 16A is a view showing three-dimensional mapping obtained by carrying out surface profiling using a white-light interferometer in the mirror device of FIG. 14A.
Figure 16B:
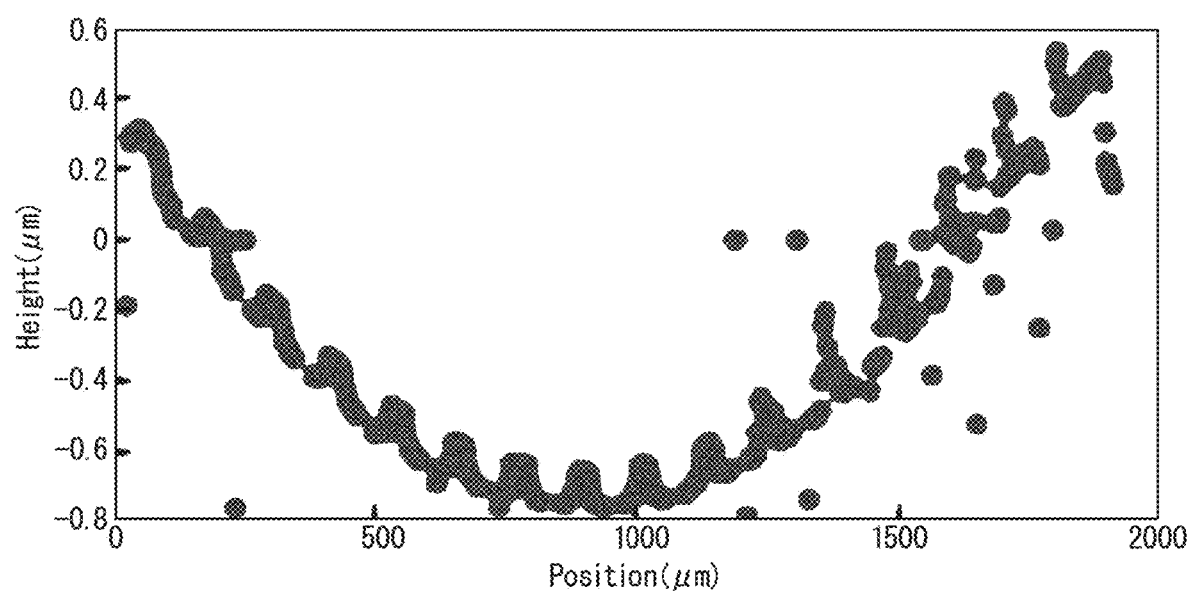
FIG. 16B is a graph showing a height distribution along a cross section in a direction of a line VIIII-VIIII of FIG. 16A.

FIG. 16A is a view showing three-dimensional mapping obtained by carrying out surface profiling using a white-light interferometer in the mirror device 1F of FIG. 14A. FIG. 16B is a graph showing a height distribution along a cross section in a direction of a line of FIG. 16A.

As shown in FIG. 16A and FIG. 16B, in the reflection member 30F of the mirror device 1F, when the shaft member 20F (location: 1,000 μm) is regarded as the center, displacement in a height direction increases as the position moves away from the shaft member 20F along the width direction (D2 direction). The height of the shaft member 20F (location: 1,000 μm) is approximately −0.8 μm, and the height of an outer edge (location: 0 μm or 2,000 μm) of the reflection member 30F is approximately 0.5 μm, and thus the surface displacement of the reflection member 30F is approximately 1.3 μm. From this result, it is found that a flat surface is formed in the reflection member 30F and the dynamic deformation amount in the thickness direction can be decreased.

According to the present modification example, the base portion includes the third side wall portion group 313FF formed of the plurality of pairs of third side wall portions 313Fa and 313Fb extending in the second direction (D4 direction) intersecting the first direction and the fourth side wall portion group 314FF formed of the plurality of pairs of fourth side wall portions 314Fa and 314Fb extending in the third direction (D5 direction) intersecting both the first direction and the second direction, and thus it is possible to further improve the stiffness of the base portion 31F against stress in the D3 direction, and it is possible to improve the stiffness of the base portion 31F against stress in the in-plane direction that is regulated by the D1 direction and the D2 direction. In addition, the base portion 31F has the fourth hollow portion 317F, and thus it is possible to further reduce the weight of the reflection member 30F.

Figure 17:
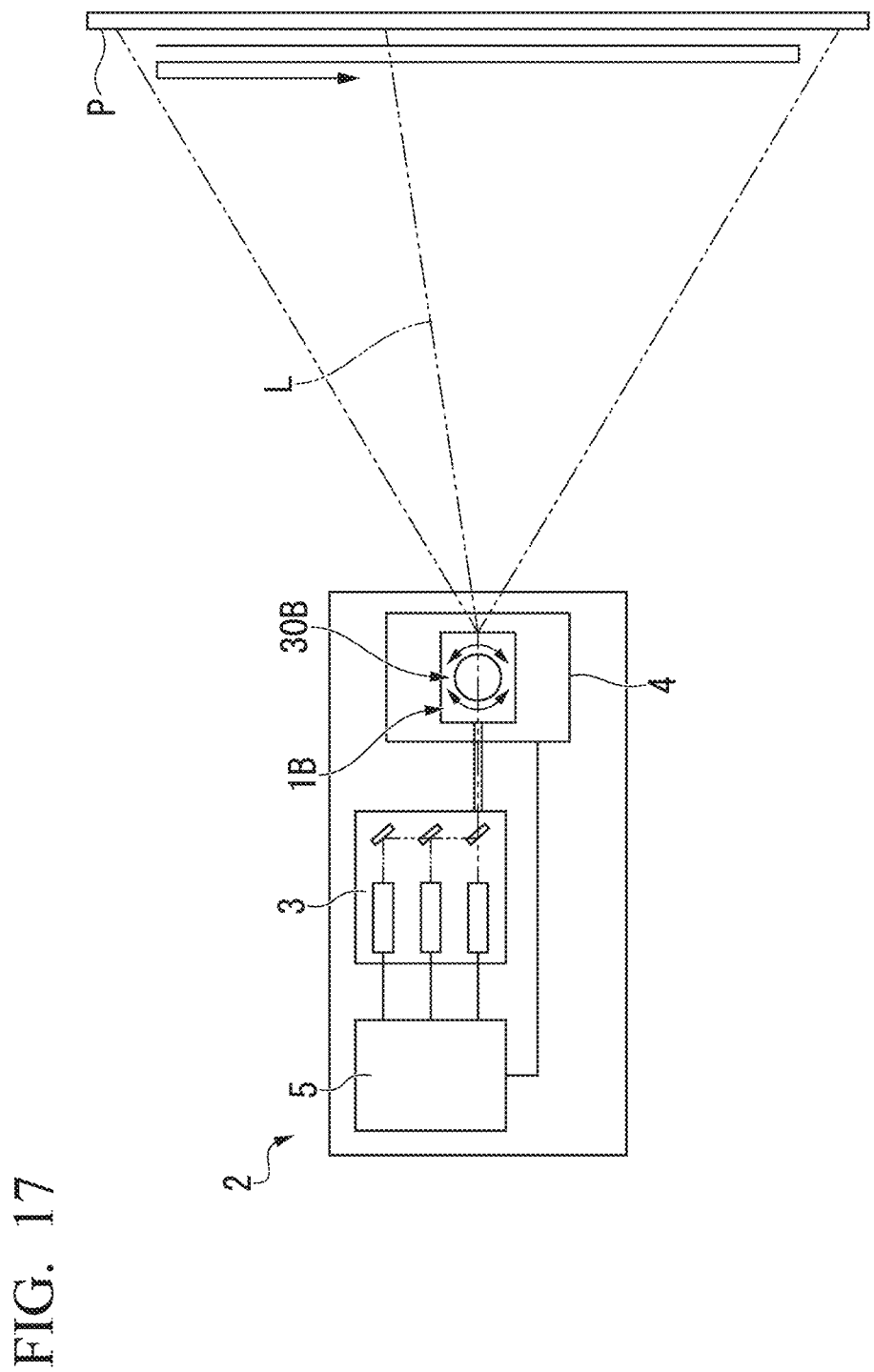
FIG. 17 is a schematic view showing an example of a configuration of a scanning laser device according to the embodiment of the present disclosure.

FIG. 17 is a schematic view showing an example of a configuration of a scanning laser device according to a second embodiment of the present disclosure. In the present embodiment, a case where a scanning laser device is applied to a scanning laser display device will be described as an example.

As shown in FIG. 17, a scanning laser device 2 includes a laser light source 3, the mirror device 1B, and a driving mechanism 4 that drives the mirror device 1B. This scanning laser device 2 is, for example, a scanning laser display device, and an image is displayed on a screen panel P by scanning laser light L from the scanning laser device 2. In addition, the scanning laser device 2 includes a control portion 5 that generally controls individual configurational elements in the device.

The laser light source 3 has three light emission elements corresponding to three primary colors of RGB and radiates laser light from these light emission elements to the reflection member 30B of the mirror device 1B. The laser light is not particularly limited and is, for example, a parallel laser beam. Three laser light rays are multiplexed at, for example, an optical waveguide or the like and output to the mirror device 1B.

The mirror device 1B is monoaxially or biaxially provided. In the case of biaxially provided, the mirror device includes, for example, a frame body provided so as to capable of rotating and a reflection member having a second rotation axis orthogonal to a first rotation axis of the frame body. In such a case, the laser light is scanned in the horizontal direction and the vertical direction. Alternatively, two monoaxial mirror devices may be provided in the scanning laser device and disposed so that the two rotation axiss thereof are orthogonal to each other. In addition, the mirror device is not limited to the mirror device 1B, and any or a plurality of the mirror devices 1A to 1F may be provided in the scanning laser device 2.

The driving mechanism 4 monoaxially or biaxially swings the reflection member 30B in the mirror device 1B by an electromagnetic driving method, an electrostatic driving method, or a piezoelectric driving method in which a comb tooth actuator is used. The driving mechanism 4 is capable of obtaining an operation resonant frequency by mechanically resonating the reflection member 30B in order to increase the optical scanning angle of the reflection member 30B. The reflection member 30B in the mirror device 1B has a larger diameter and a lighter weight than those in the related art, and the dynamic deformation amount in the thickness direction (D3 direction) of the reflection portion 32B is small, and thus it is possible to increase the operation resonant frequency to be larger than in the related art.

As described above, according to the present embodiment, the scanning laser device 2 capable of realizing a high resolution than in the related art is provided.

Hitherto, the embodiments of the present disclosure have been described in detail, but the present disclosure is not limited to the above-described embodiments and can be transformed or modified in a variety of manners within the scope of the gist of the present disclosure described in claims.

The scanning laser device of the present disclosure can be applied to, for example, scanning laser devices that are mounted in mobile phones, portable displays, wearable instruments, cars, ophthalmic instruments, and the like. In addition, the scanning laser device can also be applied to devices that not only scan screens or car windshields but also scan retinas. Furthermore, the scanning laser device can be used not only for scanning laser display devices but also for industrial sensing, medical measurement, and the like. For example, it is possible to apply the scanning laser device to, as an operation support system of cars, scanning laser measurement instruments that measure the distance between a car and an object.

While preferred embodiments of the disclosure have been described and illustrated above, it should be understood that these are exemplary of the disclosure and are not to be considered as limiting. Additions, omissions, substitutions, and other modifications can be made without departing from the spirit or scope of the present disclosure. Accordingly, the disclosure is not to be considered as being limited by the foregoing description, and is only limited by the scope of the appended claims.

What is claimed is:

1. A mirror device comprising:
a frame body;
a shaft member provided inside the frame body and connected to the frame body; and
a reflection member fixed to the shaft member and provided so as to swing around an axis of the shaft member,
wherein the reflection member has a base portion provided along an axial direction of the shaft member and a reflection portion provided on the base portion, and
the base portion has a three-dimensional uneven structure including a bottom wall portion having a main surface provided along the axial direction of the shaft member and a plurality of side wall portions extending from the bottom wall portion opposite to the reflection portion.

2. The mirror device according to claim 1,
wherein a ratio of a height to a thickness of the side wall portion is 20 or more and 100,000 or less.

3. The mirror device according to claim 1,
wherein the base portion is formed of an ALD layer and/or an MLD layer.

4. The mirror device according to claim 1,
wherein the plurality of side wall portions is formed of a plurality of fins disposed at intervals in the axial direction of the shaft member.

5. The mirror device according to claim 1,
wherein the base portion includes the bottom wall portion, a first side wall portion group formed of a plurality of pairs of first side wall portions extending in a first direction in a plan view of the base portion, and a first upper wall portion group formed of a plurality of first upper wall portions that couples the pair of first side wall portions.

6. The mirror device according to claim 5,
wherein the base portion further includes a pair of second side wall portions disposed so as to surround the first side wall portion group in a plan view of the base portion and a second upper wall portion that couples the pair of second side wall portions and is connected to the first upper wall portion group.

7. The mirror device according to claim 6,
wherein a through hole is provided in at least one of the first upper wall portion and the second upper wall portion,
the bottom wall portion, the pair of first side wall portions, and the first upper wall portion define a first hollow portion, and
the bottom wall portion, the pair of second side wall portions, and the second upper wall portion define a second hollow portion.

8. The mirror device according to claim 1,
wherein the base portion includes the bottom wall portion, a first side wall portion group formed of a plurality of pairs of first side wall portions extending in a first direction in a plan view of the base portion, and a third side wall portion group formed of a plurality of pairs of third side wall portions that extends in a second direction intersecting the first direction and couples the pairs of first side wall portions.

9. The mirror device according to claim 8,
wherein the first side wall portion group and the third side wall portion group are disposed in a grid shape in a plan view of the base portion.

10. The mirror device according to claim 9,
wherein the base portion further includes a third upper wall portion group formed of a plurality of third upper wall portions that is defined by two adjacent first side wall portions and two adjacent third side wall portions in a plan view of the base portion,
one or a plurality of through holes is provided in the third upper wall portion, and
the bottom wall portion, the pair of first side wall portions, the pair of third side wall portions, and the third upper wall portion define a third hollow portion.

11. The mirror device according to claim 1,
wherein the base portion includes the bottom wall portion, a first side wall portion group formed of a plurality of pairs of first side wall portions extending in a first direction in a plan view of the base portion, a third side wall portion group formed of a plurality of pairs of third side wall portions extending in a second direction intersecting the first direction, and a fourth side wall portion group formed of a plurality of pairs of fourth side wall portions extending in a third direction intersecting both the first direction and the second direction.

12. The mirror device according to claim 11,
wherein the first side wall portion group, the third side wall portion group, and the fourth side wall portion group form a truss-shaped structure in a plan view of the base portion.

13. The mirror device according to claim 12,
wherein the base portion further includes a fourth upper wall portion that is defined by the first side wall portion group, the third side wall portion group, and the fourth side wall portion group in a plan view of the base portion,
one or a plurality of through holes is provided in the fourth upper wall portion,
the bottom wall portion, the pair of first side wall portions, and a first portion of the fourth upper wall portion define a first portion of a fourth hollow portion,
the bottom wall portion, the pair of third side wall portions, and a second portion of the fourth upper wall portion define a second portion of the fourth hollow portion, and
the bottom wall portion, the pair of fourth side wall portions, and a third portion of the fourth upper wall portion define a third portion of the fourth hollow portion.

14. The mirror device according to claim 1, further comprising:
a pair of comb tooth portions provided in any of the frame body and the shaft member.

15. The mirror device according to claim 1,
wherein the base portion is formed of a metal oxide.

16. The mirror device according to claim 15,
wherein the metal oxide is Al2O3.

17. A scanning laser device comprising:
a laser light source;
the mirror deice according to claim 1; and
a driving mechanism that is configured to drive the mirror device.

18. The scanning laser device according to claim 17 wherein the scanning laser device is a scanning laser display device.

* * * * *